United States Patent
Kawakami et al.

[11] Patent Number: 5,892,237
[45] Date of Patent: *Apr. 6, 1999

[54] CHARGED PARTICLE BEAM EXPOSURE METHOD AND APPARATUS

[75] Inventors: Kenichi Kawakami; Hiroshi Yasuda; Akio Yamada; Tatsuro Ohkawa; Mitsuhiro Nakano; Atsushi Saito; Yoshihisa Ooae, all of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 815,436

[22] Filed: Mar. 11, 1997

[30] Foreign Application Priority Data

| Mar. 15, 1996 | [JP] | Japan | 8-058661 |
| Apr. 26, 1996 | [JP] | Japan | 8-108229 |
| Apr. 26, 1996 | [JP] | Japan | 8-108249 |

[51] Int. Cl.$^6$ ................................................ H01J 37/304
[52] U.S. Cl. ..................................... 250/492.22; 250/491.1
[58] Field of Search ............................ 250/492.22, 491.1, 250/492.2

[56] References Cited

U.S. PATENT DOCUMENTS

| 4,818,885 | 4/1989 | Davis et al. ........................... 250/491.1 |
| 5,325,180 | 6/1994 | Chappelow et al. ................... 250/491.1 |
| 5,329,130 | 7/1994 | Kai et al. .............................. 250/492.22 |
| 5,334,846 | 8/1994 | Nakano et al. ........................ 250/492.2 |

FOREIGN PATENT DOCUMENTS

| 1215902 | 12/1970 | United Kingdom .............. 250/440.11 |

*Primary Examiner*—Jack I. Berman
*Attorney, Agent, or Firm*—Staas & Halsey

[57] ABSTRACT

In a charged particle beam exposure method and an apparatus therefor, wherein the intensity of the charged particle beam used for irradiation is increased to a maximum to improve a throughput for an exposure procedure, accordingly, the temperature of a sample, such as a wafer, is elevated and thermal expansion occurs. The thermal expansion that occurs has reproducibility based on the intensity of the projected charged particle beam. Therefore, a coefficient of thermal expansion is detected by monitoring the intensity of the projected charged particle beam. A shifting distance for each irradiation position which is acquired from the thermal expansion is added as a compensation value for deflection of the charged particle beam, to provide an accurate exposure procedure.

19 Claims, 26 Drawing Sheets

SIMULATION RESULT

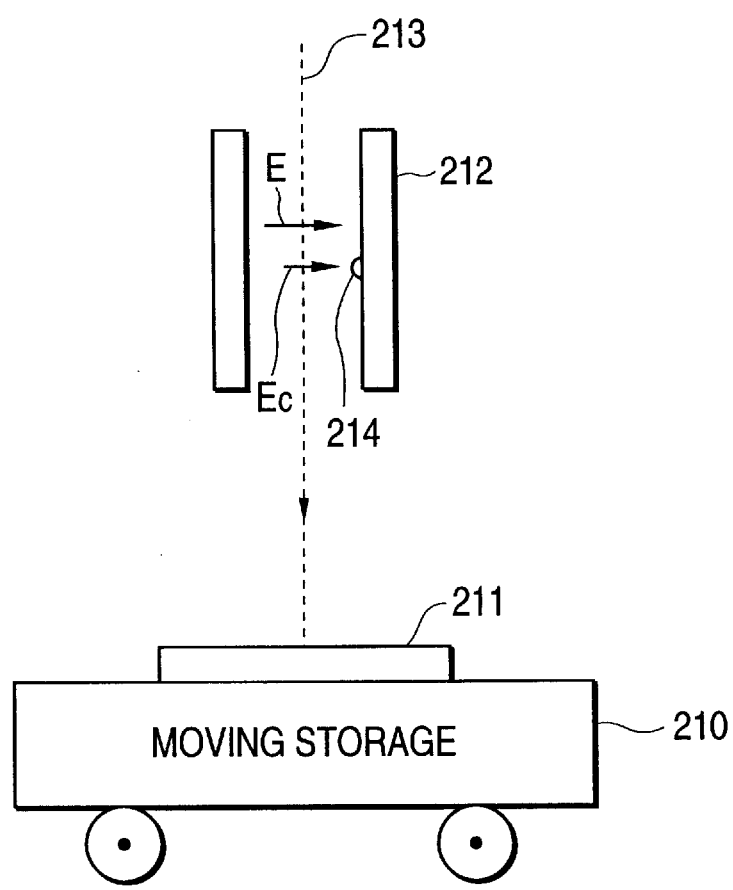

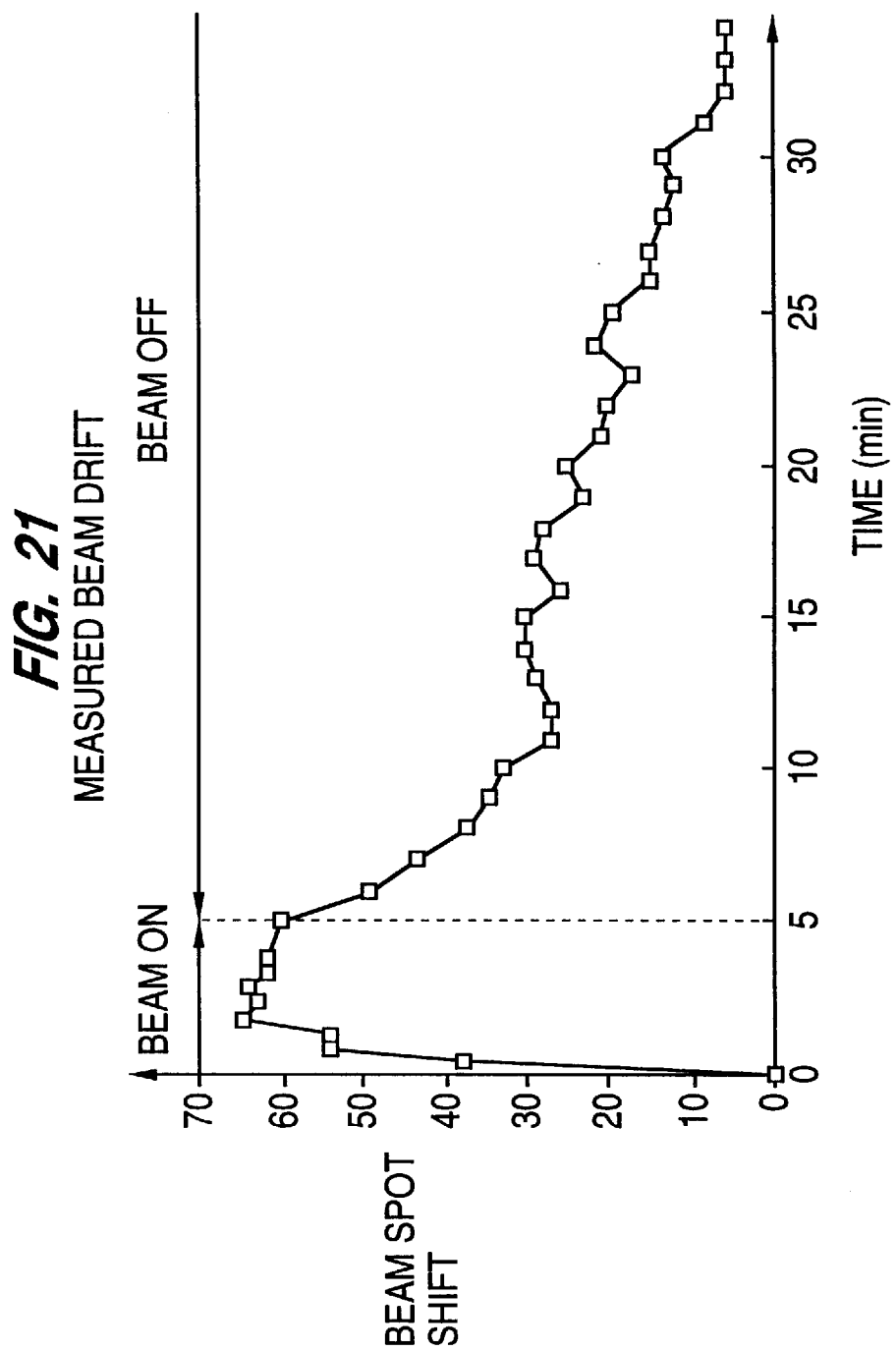

CHARGE-UP MODEL

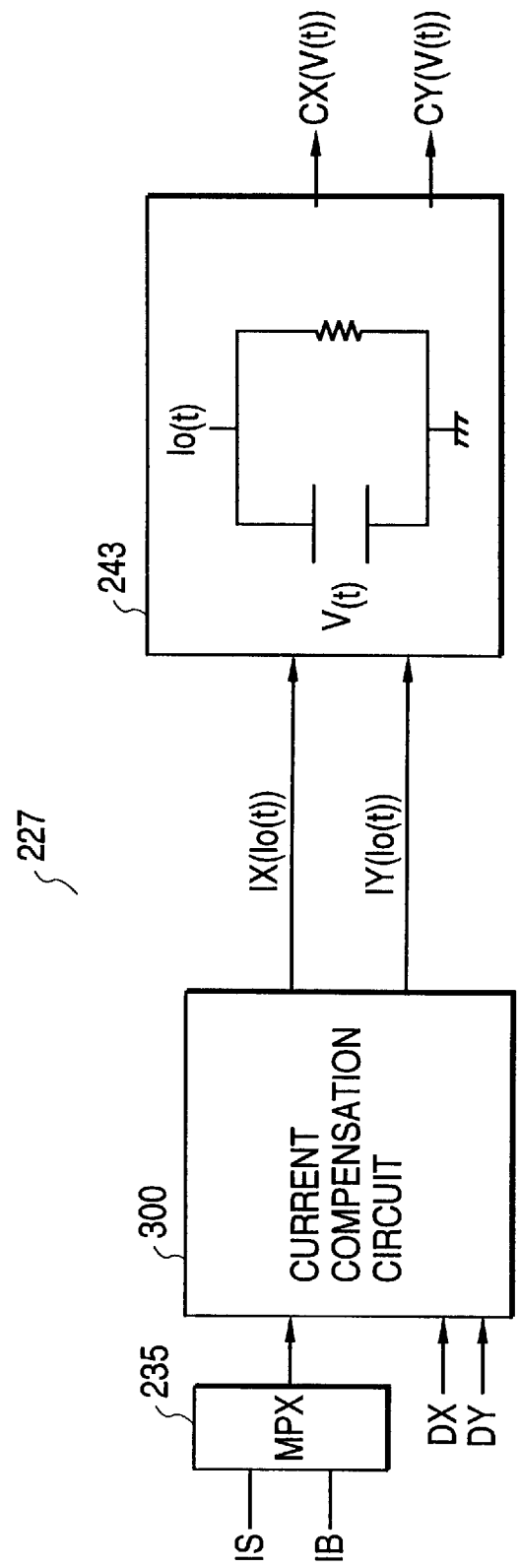

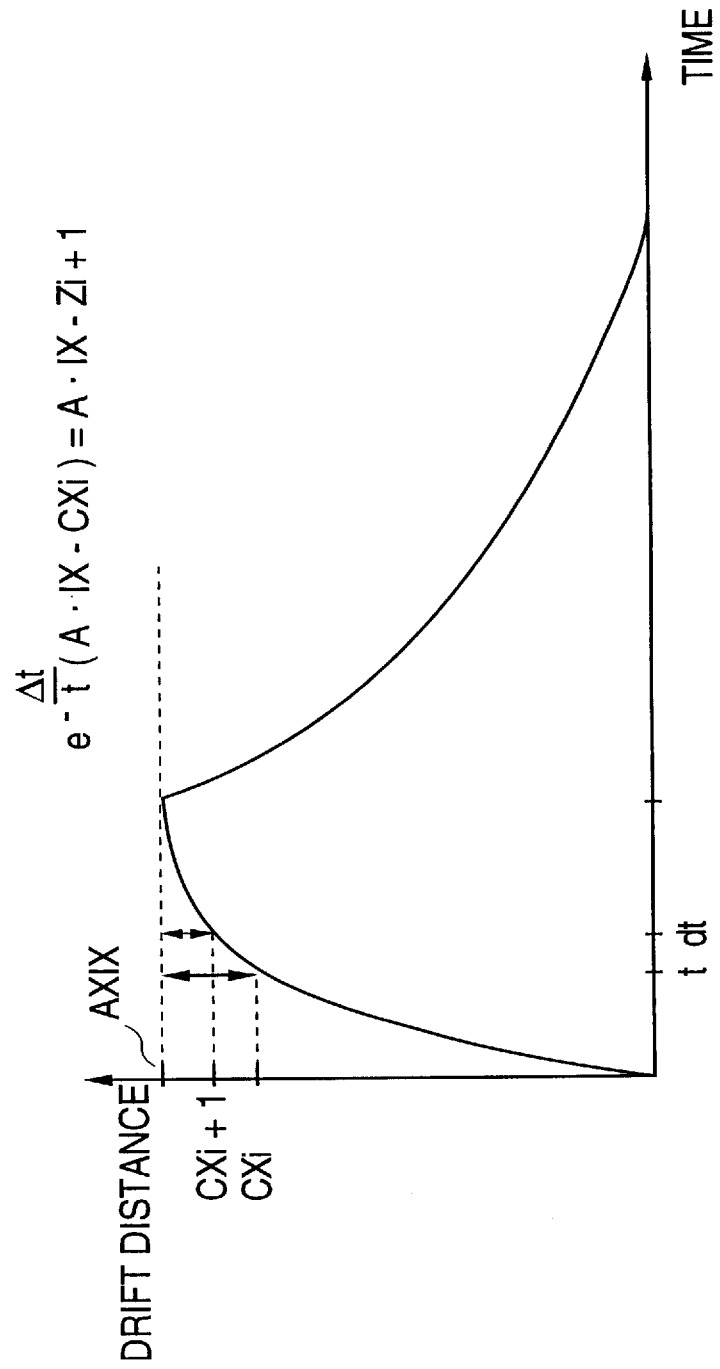

CHARGED PARTICLE BEAM EXPOSURE METHOD AND APPARATUS

BACKGROUND OF THE INVENTION

1. Field of the Invention

The present invention relates to a charged particle beam exposure method for employing a charged particle beam, such as an electron beam or an ion beam, when performing an exposure, and in particular, to a charged particle beam exposure method, and an apparatus therefor, for correcting for the shifting of an exposure position, which accompanies the thermal expansion of a wafer, or beam drift due to a charge-up, which occurs when the entire surface of a wafer is exposed within a short period of time.

2. Related Arts

An electron beam exposure method (hereinafter this phrase is employed to simplify the explanation), one of the charged particle beam exposure methods, is a lithography tool that has both a high resolution capacity and a pattern generation capacity, and that is employed for the exposure of a reticle or the direct exposure of a semiconductor wafer. However, with the common electron beam exposure method, a desired drawing pattern is calculated, based on the electronic data for a pattern to be drawn, and an electron beam for the pattern is sequentially emitted to expose a reticle or a wafer. Since an area that can be exposed by a single emission beam is comparatively narrow, a process for using an electron beam having a predetermined pattern to expose a plurality of fields obtained by dividing a chip must be repeated a number of times. As a result, a long time is required for an exposure, while the throughput is smaller than that provided by a stepper exposure method that uses light.

At present, therefore, the electron beam exposure method is mainly used with a procedure employed for exposing a reticle, or with a procedure for exposing a sample for a new device. Thereafter, a reticle mask produced in this manner is employed to expose a large area on a wafer by employing the stepper exposure method that uses light, so that semiconductor devices can be mass produced.

A high density and microstructures will be required in the future for large capacity semiconductor devices, such as DRAMs (Dynamic Random Access Memories), and it is anticipated that the conventional stepper exposure method will not be able to cope with the revolution increase.

In order to fabricate 256M bit DRAMs, because of microstructure, the employment of the technique for directly exposing a wafer by using the electron beam exposure method is inevitable. For this reason, the conventional problem posed by inadequate throughput must be resolved, and the exposure accuracy must also be improved, even as the throughput is increased.

Assuming that the technique for exposing a wafer directly to an electron beam is the technique employed for the mass production of semiconductor devices, in this case, it is necessary to draw a single 8-inch wafer about five minutes, for example. To effect an exposure in such a short time, a block exposure method or a blanking aperture array method, both of which have been conventionally proposed, could be employed. According to these methods, a general pattern obtained by combining several variable rectangular beam shots can be exposed within a single shot, and therefore a throughput is expected to be increased several times. However, the number of electron beams per unit time with which the wafer will be irradiated will also be increased several times. The accumulated quantity of charged particles is referred to as the "volume" herein.

A limit is imposed on the current of an electron beam when an image is blurred by Coulomb interactions between electrons. For example, 2 to 4 $\mu$A is the limit for an image dissection of 0.2 $\mu$m. When a beam current exceeds the limit, an irradiated image will be blurred by the interaction of the electrons in the beam. Therefore, for resolution, a beam current of about 0.2 $\mu$m is considered to be the limit. With an acceleration voltage of 50 kV, a wafer is irradiated with an energy of 0.1 to 0.2 W, and for five minutes (300 seconds) a thermal energy of 30 to 60 J (Joule) is supplied to the wafer. Even assuming that 50% of this thermal energy is transferred from the wafer to the holder of the apparatus and exhausted, if the thermal capacity of the 8-inch wafer is approximately 16 J/K, the temperature of the wafer is raised 1 to 2° C. When the linear expansion of a Si wafer is 2.6 ppm/K, a thermal expansion with a coefficient of 3 to 5 ppm (point per meter: $\mu$m to be expanded per 1 m) will occur.

For the 8-inch wafer, for example, the actual shift caused by the thermal expansion is 0.45 to 0.75 $\mu$m with an expansion coefficient of 3 to 5 p$\mu$m. Since the shifting distance from the center is about 0.3 $\mu$m, which is about the half of the above value, this shifting can not be ignored when fabricating 256-M DRAM, for which a line width of 0.2 $\mu$m is required.

To improve the throughput when a wafer is directly irradiated by an electron beam, an effective method is the continuous movement method, one whereby a stage on which the wafer is mounted is in constant movement while the wafer is being exposed. In a conventional step-and-repeat method in which an exposure in a main deflection area is repeated by moving a stage between the areas, the setting time accompanied by a halt following the movement of the stage prevents the improvement of the throughput.

According to the continuous wafer movement method, a wafer travels along a frame area that is narrower than a single chip but is sufficiently wide to permit a main deflector, constituted by an electromagnetic coil, to deflect the electron beam. Therefore, a single chip area is covered with a plurality of frame areas, and even if the location of a positioning mark, which is provided near a chip area on a wafer, is detected and the origin of the beam is corrected, it takes an extended period of time for the exposure of the pertinent chip area to be completed. Since irradiation of a large volume of an electron beam is performed during this period, the temperature of the wafer is raised and the wafer is expanded. This problem can not be avoided when the continuous wafer movement method, together with a stronger electron beam, is employed to perform direct exposure of a wafer for fabrication of a microstructure.

Further, the increase in the intensity of the beam is accompanied not only by a rise in the temperature but also by beam drift, which is caused by a charge-up related to the contamination of the exposure apparatus. The accumulation of electric charges in an organic substance, such as a resist attached to an electrostatic deflector, that results in a shift in the deflection distance of the deflector is known as beam drift, which is due to a charge-up.

The explication of the behavior of beam drift is very difficult, and how a value to compensate for beam drift should be determined has not yet been resolved. It is proposed that, when the intensity of a beam is increased for direct irradiation of a wafer, the drift of the beam will be changed during the irradiation of a single wafer. This problem must also be resolved.

SUMMARY OF THE INVENTION

It is, therefore, one object of the present invention to provide, as an exposure procedure for the mass production of highly integrated semiconductor circuits, a charged particle beam exposure method by which an exposure pattern can be drawn by direct irradiation of a wafer with a charged particle beam, and an apparatus therefor.

It is another object of the present invention to provide a charged particle exposure method by which throughput is so improved that it is to be employed for the mass production procedures, and an apparatus therefor.

It is an additional object of the present invention to provide a charged particle beam exposure method by which the influence of beam drift due to a charge-up, which accompanies the irradiation by a charged particle beam, can be compensated for even when throughput is so improved that the method can be employed for mass production.

To achieve the above objects, according to one aspect of the present invention, a charged particle beam exposure method, wherein a charged particle beam having an exposure pattern shape is deflected to irradiate a desired location on a sample based on exposure data, comprises the steps of:

acquiring a thermal expansion of the sample associated with irradiation by the charged particle beam based on a volume of the charged particle beam for irradiating the sample;

acquiring a shift from the desired position as a correction distance based on the thermal expansion; and deflecting the charged particle beam in accordance with a deflection amount including the correction distance so as to irradiate the sample with the deflected beam.

When the intensity of the beam used for irradiation is increased to the maximum to improve the throughput for the exposure procedure, accordingly, the temperature of the sample, such as a wafer, is elevated and thermal expansion occurs. The thermal expansion that occurs has reproducibility based on the intensity of the projected beam. Therefore, the thermal expansion can be detected by monitoring the intensity of the projected beam. The shifting distance for each irradiation position which is acquired from the thermal expansion is added as a compensation value for the deflection of the beam, and provides an accurate exposure procedure.

The intensity of the irradiated charged particle beam can be acquired from a beam density of a charged particle generator and a density of the exposure pattern. The intensity of the charged particle beam projected can also be acquired from a volume of a current that flows from the holder, which holds the sample while it is irradiated by the charged particle beam. Further, the intensity of the irradiated charged particle beam can also be acquired from a volume of electrons that are reflected from the sample during the irradiation by the charged particle beam.

At the step of acquiring the thermal expansion, the thermal expansion is acquired by employing a thermal capacity of the sample, a thermal capacity of the holder which holds the sample, and thermal conductivity between the sample and the holder, and thermal energy based on the intensity of the charged particle beam that is projected.

According to another aspect of the present invention, a charged particle beam exposure method, by which a charged particle beam shaped in an exposure pattern based on exposure data is deflected and irradiates at a desired position on a sample, comprises the steps of:

acquiring thermal expansion of the sample associated with irradiation by the charged particle beam based on a volume of the charged particle beam that irradiates to the sample;

acquiring a shifting distance and a rotational distance for the sample resulting from the thermal expansion;

acquiring a distance shifted away from the desired position to serve as a correction distance based on the thermal expansion, the shifting distance and the rotational distance; and deflecting the charged particle beam in accordance with a deflection value including the correction distance to irradiate the sample with the deflected beam.

When thermal expansion occurs, the position of the center of the wafer is accordingly moved and rotated. The shifting distance and the rotational distance for the center position are acquired to enable irradiation with the beam of a precisely calculated location.

At the step of acquiring for the sample the shifting distance and the rotational distance occasioned by the thermal expansion, a shifting distance and a rotational distance for the sample that occur in accordance with each thermal expansion are measured in advance, and the measured distances are employed to calculate the shifting distance and the rotational distance for the sample.

At the step of acquiring for the sample the shifting distance and the rotational distance caused by the thermal expansion, as an alternative, a location of a mark formed on the sample is detected to acquire for the sample the shifting distance and the rotational distance.

According to an additional aspect of the present invention, a charged particle beam exposure method, wherein an exposure is performed by irradiating a charged particle beam to a wafer while the wafer, on which a plurality of chips are arranged, is continuously moved along the chip area, comprises the steps of:

(a) detecting an alignment mark located in each of exposure unit areas to acquire a shifting distance for a deflected position of the charged particle beam, the wafer being divided into a plurality of exposure unit areas, in each of which includes a plurality of chip areas fewer than a predetermined count;

(b) performing exposure processing within each of the exposure unit areas by correcting the deflection position of the charged particle beam in accordance with the shifting distance; and repeating said steps (a) and (b) for each of the exposure unit areas.

According to the present invention, the continuous stage moving method can be employed to enhance throughput and to correct for displacement due to thermal expansion, which results from a rise in the temperature.

According to a further aspect of the present invention, a charged particle beam exposure method, in which a charged particle beam is deflected and irradiated to a desired surface location on a sample so as to perform an exposure process for a desired pattern, comprises the steps of:

acquiring a drift distance for changing a location to which the charged particle beam is deflected based on a physical value corresponding to a volume of the charged particle beam; and performing exposure process by correcting a deflection distance for the charged particle beam in accordance with the drift distance.

According to the present invention, it is possible to correct for the displacement, which is caused by beam drift due to a charge-up, of a location to which a beam is deflected.

BRIEF DESCRIPTION OF THE DRAWINGS

FIG. 20 is a diagram for explaining beam drift due to a charge-up;

FIG. 21 is a graph showing the results obtained by measuring the beam drift due to a charge-up;

FIG. 23 is a schematic diagram illustrating a beam drift correction circuit based on the above described idea;

FIG. 26 is a graph for explaining the principle of a correction calculation circuit.

DETAILED DESCRIPTION OF THE PREFERRED EMBODIMENTS

The preferred embodiments of the present invention will now be described while referring to the accompanying drawings. The technical scope of the present invention, however, is not limited to these embodiments. Although the following embodiments are explained for an electron beam exposure method as an example, the present invention is not limited to an electron beam, and can be applied to any other charged particle beam.

Figure 1:
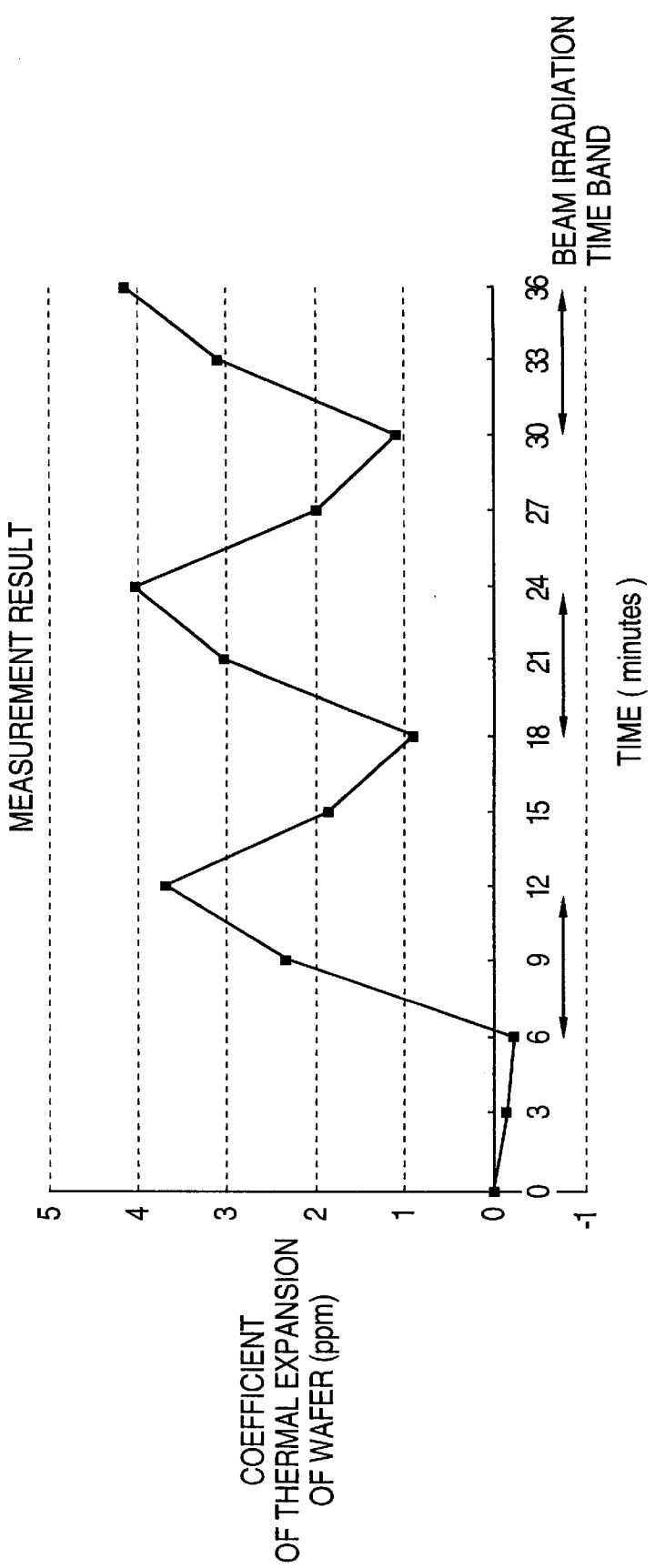
FIG. 1 is a graph showing the coefficient of thermal expansion of a silicon wafer during the irradiation performed by an electron beam.

FIG. 1 is a graph showing the results obtained by measuring a coefficient of thermal expansion of a silicon wafer after the present inventors, using an electron beam exposure apparatus, alternately irradiated a wafer with an electron beam for six minutes, and halted the emission of the electron beam for six minutes. An electron beam having an acceleration voltage of 50 kV and a current of 3 $\mu$m was employed to irradiate the center of the silicon wafer. As is apparent from the results of the experiment shown in FIG. 1, the silicon wafer expanded about 4 ppm during the six-minute irradiation period, and shrank by about the same amount during the six minute period in which no irradiation took place. For the 8-inch wafer, as is described above, a thermal expansion from its center is about 0.3 $\mu$m, which is not acceptable. To acquire a line width of 0.2 $\mu$m, the shifting distance should be one tenth to one twentieth of the result, and in the example in FIG. 1, the thermal expansion should be reduced, for example, to 0.2 ppm.

Since, for the electron beam exposure in this invention, a single wafer must be drawn in about five minutes using a large amount of current, the thermal affect due to the irradiation by the electron beam is dominant during this period. If the amount of the current for the irradiated electron beam is taken into consideration, the expansion of a wafer, which is a sample, can be precisely predicted. When the position for the beam irradiation is corrected in accordance with the predicted expansion, the superimposing exposure can be performed very accurately.

Figure 2:
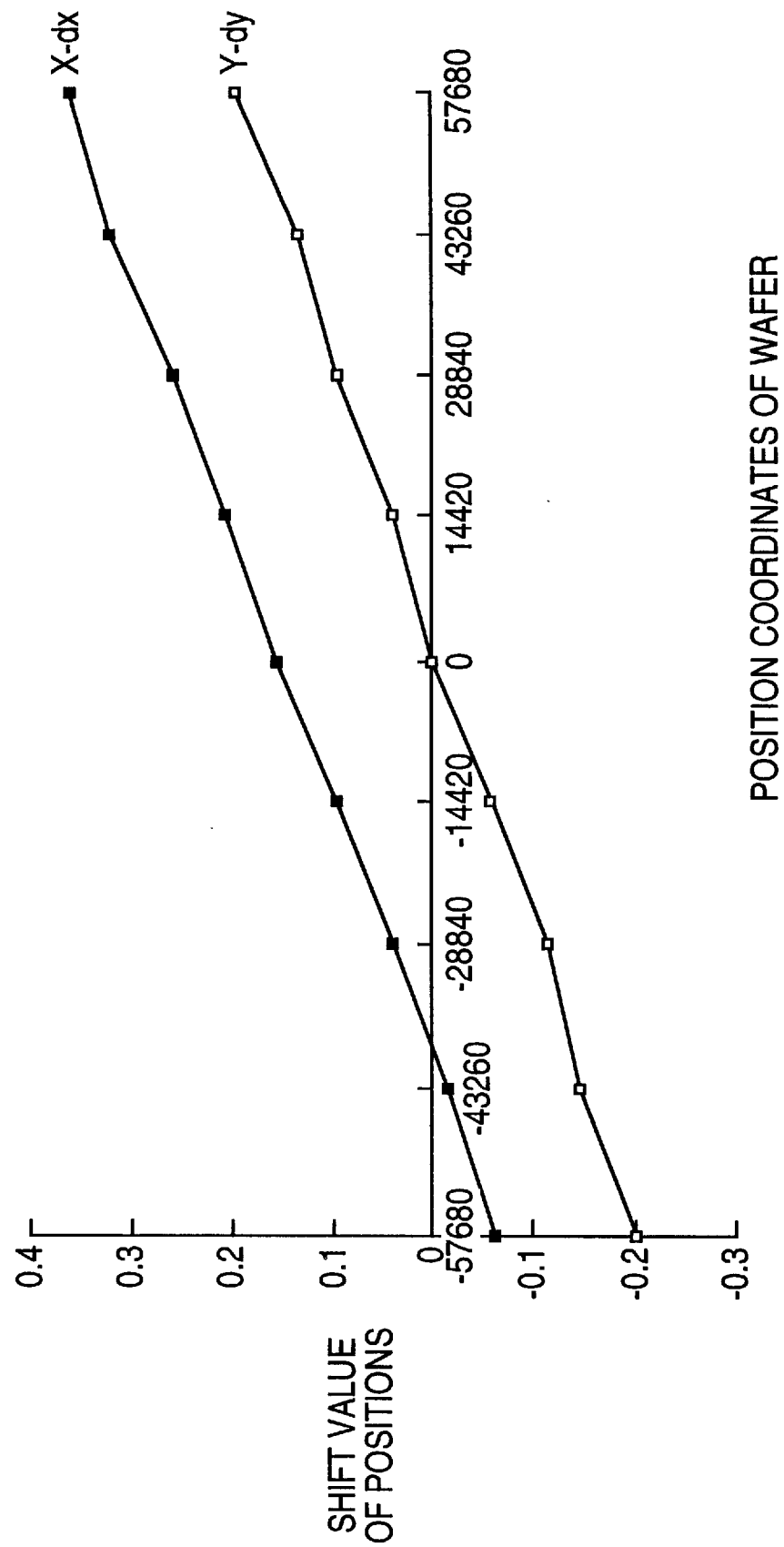
FIG. 2 is a graph showing the uniformity of thermal expansion of a silicon wafer.

FIG. 2 is a graph showing the shift value, of the individual position of the silicon wafer, that occurred when the electron beam of 50 kV and 3 $\mu$m was irradiated the center of the silicon wafer for six minutes. The horizontal axis represents the X or Y coordinates for each mark, and the vertical axis represents the shifting distance for each mark.

Figure 3:
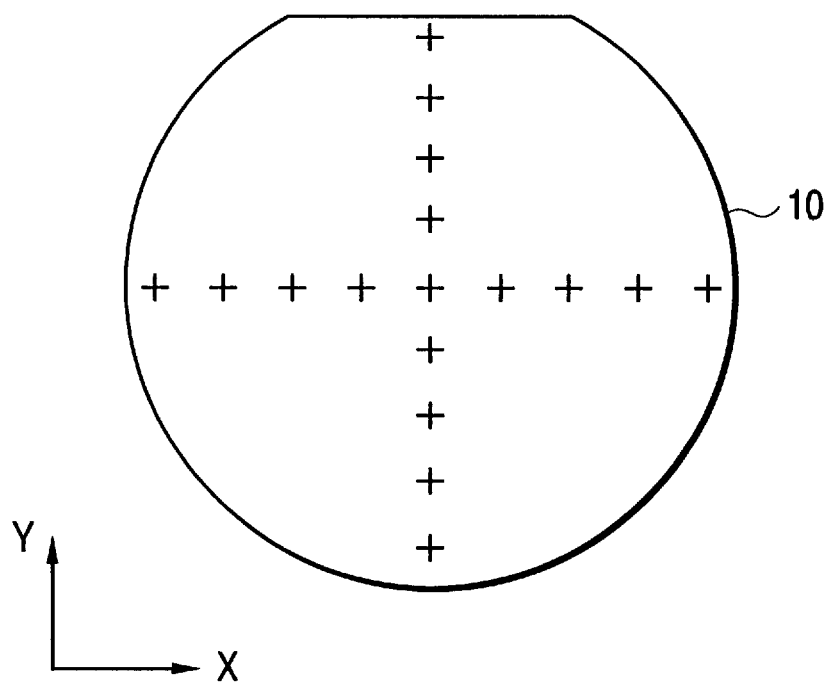
FIG. 3 is a diagram showing the locations of marks on a wafer that are used for the measurement in FIG. 2.

FIG. 3 a diagram illustrating the marks placed on a silicon wafer 10 that was actually used for the experiment in FIG. 2. Nine marks in each of the X and Y directions are arranged to form a cross.

Referring back to FIG. 2, the line of black dots is for measured shifting distances for the nine marks arranged horizontally (in the X direction) in FIG. 3. Therefore, the horizontal axis represents the X coordinate of each mark on the wafer, while the vertical axis represents the shifting distance in the Y direction. The line of white dots is for measured shifting distances for the nine marks arranged vertically (in the Y direction) in FIG. 3. The horizontal axis represents the Y coordinate for each mark on the wafer, while the vertical axis represents the shifting distance in the X direction.

As is shown in FIG. 2, the shifting distances of the locations of the marks are represented by the linear function of the position coordinates on the wafer. Therefore, it is understood that, although the electron beam irradiated only the center of the silicon wafer, the wafer expanded uniformly and isotopically. In other words, it is apparent that a silicon substrate has sufficiently high thermal conductivity, and that almost no temperature distribution occurs with the amount of heat produced by 0.2 W.

Therefore, when the energy of an electron beam used to irradiate a wafer, the thermal conductivity between the wafer and the wafer holder, and the heat capacities of the wafer and the holder are taken into account, the transient response property of the change in temperature due to irradiation by the electron beam can be calculated, and the change in the temperature of the wafer can be predicted with high reproducibility. When the change in the temperature of the wafer can be predicted, the distance required for the correction of the shifting that is caused by thermal expansion can be acquired in consonance with the location on the wafer. The present invention employs such a principle.

Figure 4:
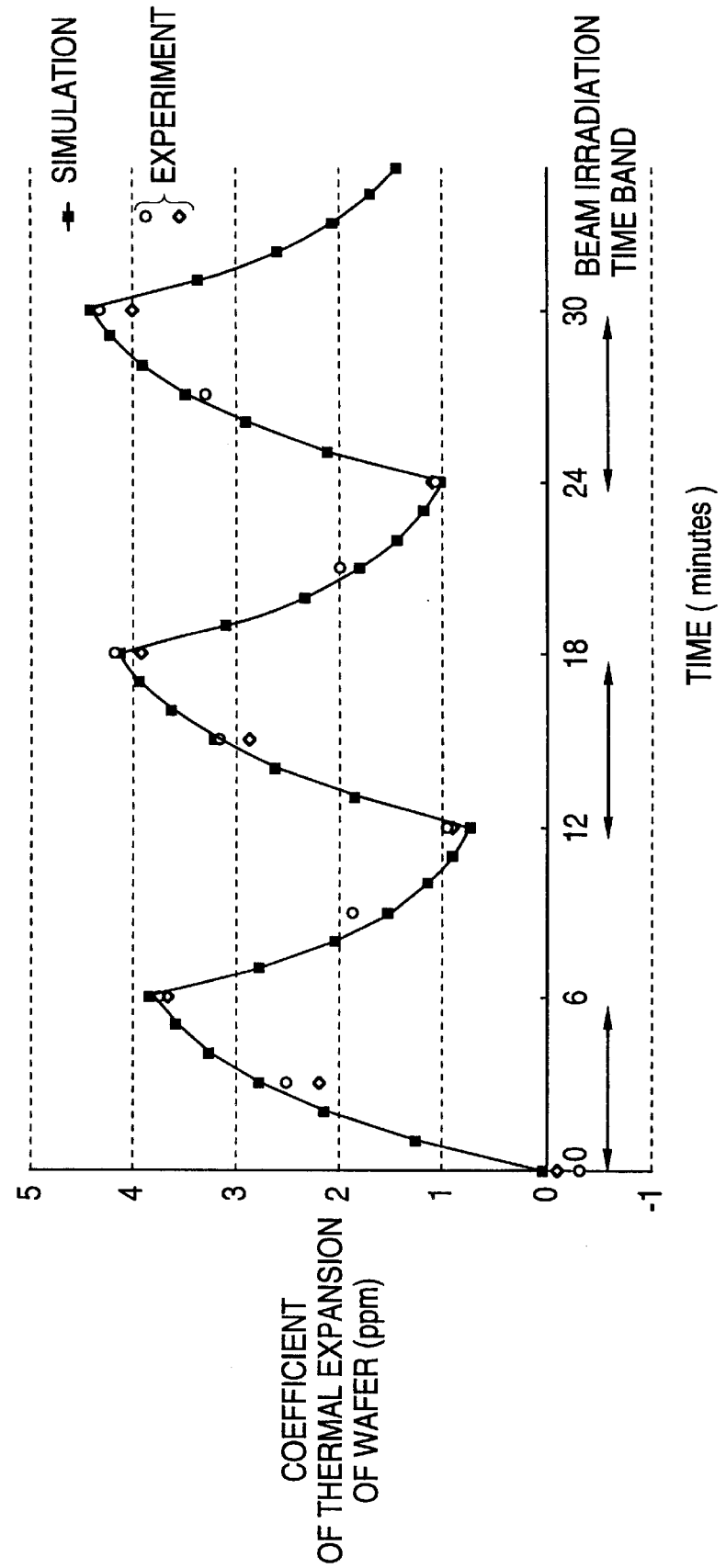
FIG. 4 is a graph showing the results of simulation of the thermal expansion of the silicon wafer during irradiation by an electron beam.

FIG. 4 is a graph showing the results of simulation by which the coefficient of thermal expansion of the silicon wafer was calculated when a period during which beam irradiation occurred for six minutes and no beam irradiation occurred for six minutes was repeated while the heat capacity (CW) of the wafer was 16 J/K, the effective heat capacity (Ch) of the holder was 500 J/K, the thermal conductivity (Kwh) between the wafer and the holder was 0.09 W/K, and the thermal energy (Peb) to be supplied to the wafer by the electron beam was 0.15 W (J/sec).

A specific calculation used for this simulation is as follows:

$\Delta Ew = \{Peb - (tw - th) \times Kwh\} \times \Delta T$ $\Delta tw = \Delta EW/Cw$ $\Delta Eh = (tw - th) \times Kwh \times \Delta T$ $\Delta th = \Delta Eh/Ch$, where T: elapsed time tw: temperature of wafer th: temperature of holder Ew: thermal energy of wafer Eh: thermal energy of holder.

The changes in the temperatures and the thermal energies of the wafer and the holder after $\Delta T$ seconds have elapsed can be obtained by the above calculation with high reproducibility. The thermal energy Peb to be supplied to the wafer can be acquired from the product of, for example, the beam density and its pattern area, or the product of the average pattern density. Normally, the beam density of an electron gun in the electron beam apparatus is determined by a set value, and the pattern density is acquired in advance from the exposure data. Therefore, when the beam density and the pattern density for a single wafer are determined to be predetermined values, the thermal energy to be supplied to the wafer during a unit hour is acquired as a value obtained by multiplying a predetermined coefficient by the product of the beam density and the pattern density.

The change in the temperature of the wafer can be obtained for each unit hour in accordance with the above calculation. The thus obtained temperature tw of the wafer is multiplied by an expansion coefficient (e.g., 2.6 (ppm/K) for the silicon wafer), yielding the coefficient of thermal expansion.

The block dots show the result of the simulation, and the white dots show the actual results obtained through the experiment. It is, therefore, apparent that the simulation is very similar to the experimental result.

When the thermal energy to be supplied to the wafer is calculated, for example, from the beam current density and the exposure pattern density while the above simulation model is used as a reference, the thermal expansion of the wafer during exposure can be predicted precisely. The thermal energy may be acquired not only from the strength of the beam current, but also from the physical value corresponding to the intensity of an actually irradiated beam, such as the strength of a current that flows across a wafer holder or the quantity of the secondary electrons that are reflected by the wafer.

As the wafer, which is the sample, is expanded, the center position of the wafer may be moved, or the wafer may be rotated. In such a case, besides the coefficient of thermal expansion, the distance the center position is shifted and the angle of rotation must be acquired. With the slight thermal expansion discussed in the present invention, if the shape of the wafer and the fixing mechanism for the holder are the same, the shifting distance of the center position of the wafer and the angle of rotation occur with superior reproducibility.

Figure 5:
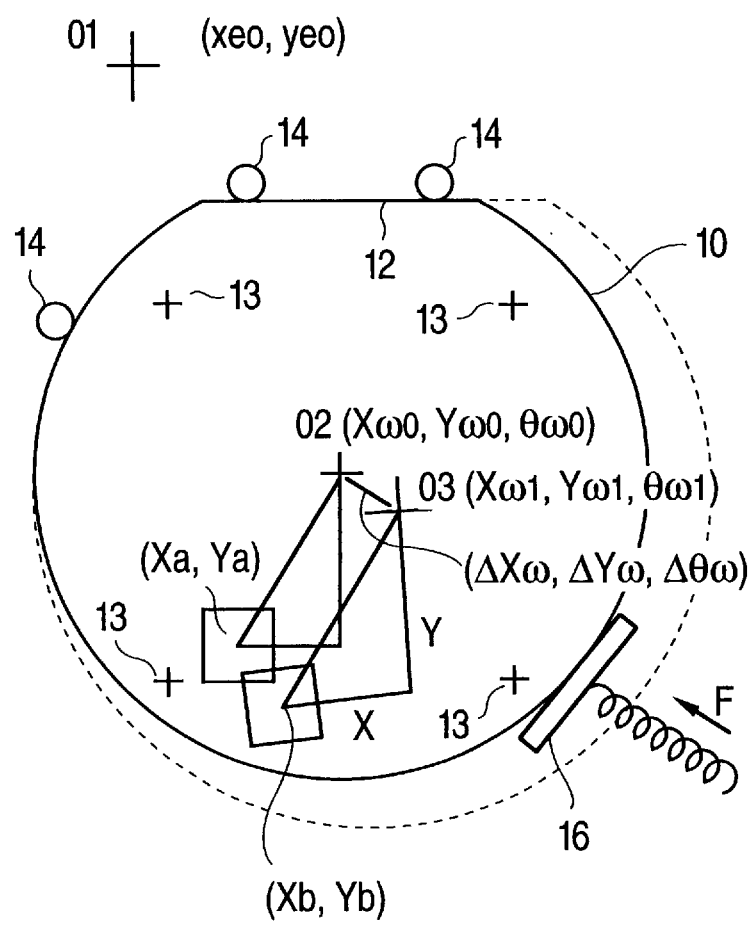
FIG. 5 is a diagram showing the relationship between a wafer and a holder.

FIG. 5 is a diagram illustrating the relationship between the wafer 10 and the holder fixing mechanism. Generally, an orientation flat 12 is provided for the wafer 10. With the flat 12 as a reference, a pressing portion 16 supports the wafer 10 by pressing it against protrusions 14 of the holder under pressure F exerted in the direction indicated by the arrow. In this case, when the wafer 10 is expanded by heat, it is deformed as is indicated by the broken lines. Thereafter, for example, the center point O2 of the wafer 10 moves to O3. Further, experience has confirmed that the wafer 10 is rotated, although the reason this occurs is not yet fully understood.

Assuming that in FIG. 5 the center of the coordinate systems of the electron beam apparatus is O1, the relationship between the center O1 and the center O2 of the wafer 10, which is loaded into the holder, is examined, so that the relationship between the coordinate systems of the original design of a pattern that is obtained by the exposure and the coordinate systems of the electron beam apparatus can be obtained. The location of the center point O2 of the wafer 10 and the angle of rotation, θw1, can be acquired by detecting the positioning marks formed on the wafer 10.

If it is found that, as a result of thermal expansion, the center O2 of the wafer 10 has been moved to O3 and the wafer 10 has been rotated to θw1, only the coefficient of thermal expansion and the exposure position (xa, ya) on the wafer 10 need be calculated to obtain the correct exposure position (xb, yb) after thermal expansion has taken place.

When an electron beam exposure apparatus is employed with which the shifting distance for the center position of the wafer 10 and the rotational distance do not occur with high reproducibility, one or two marks may be detected during the exposure process in order to measure those distances.

As is described above, the position shifting, at each location on the wafer 10, which is accompanied by thermal expansion, is calculated from the thermal energy that is supplied to the wafer, and the resultant value is provided as a correction value for the exposure apparatus. As a result, the superimposing exposure can be performed with high accuracy.

[First Embodiment]

Figure 6:
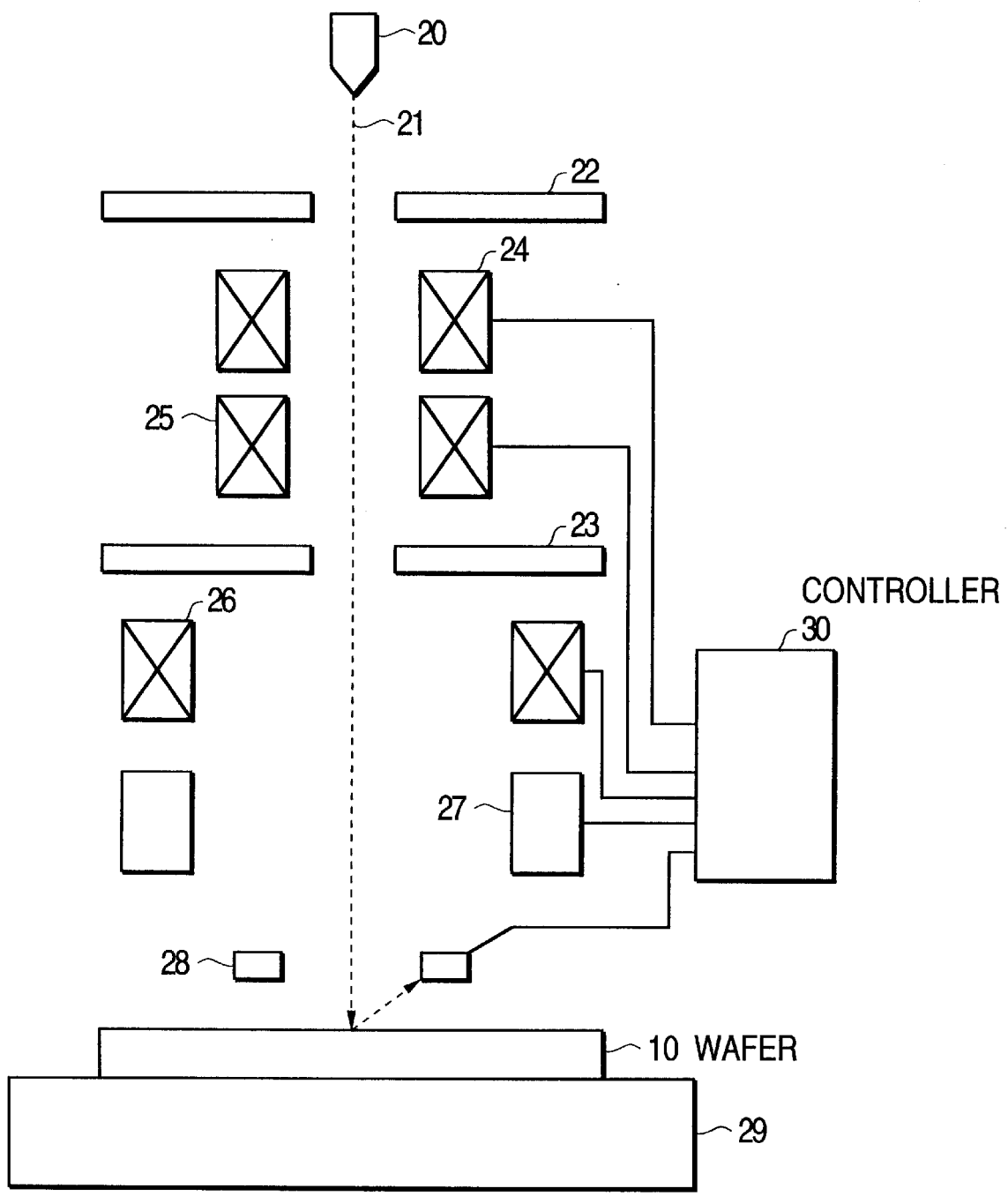
FIG. 6 is a schematic diagram illustrating the mirror barrel of an electron beam exposure apparatus.

FIG. 6 is a schematic diagram illustrating a mirror barrel corresponding to the main body of an electron beam exposure apparatus according to a first embodiment of the present invention. The present invention can be applied in a case where not only an electron beam but also another energy bearing charged particle beam is used to irradiate a sample, such as a wafer. In FIG. 6, a generation source for an electron beam is defined as a charged particle generator 20, and a beam that is emitted is defined as a charged particle beam 21. Slit deflectors 24 are located between first slits 22 and second slits 23. The electron beam 21 is formed into a rectangular beam, for example, by the first slits 22, and the rectangular beam is adequately deflected by the slit deflectors 24, so that by the inclusion of the second slits 23 an irradiation pattern can be formed. The beam 21, on which the thus obtained pattern is imposed, is deflected by deflection means 27, and the deflected beam irradiates a desired location on a sample 10, which is a wafer. It should be noted that, in addition to a rectangular pattern, a specific pattern array, etc., is formed at the second slits 23.

A holder 29, which holds the wafer 10, is also a stage that can move horizontally. Coils 25 are used to correct an image that is distorted by the first slits 22. A coil 26 is employed to correct the rotation of the beam 21, and means 28 detects electrons that are reflected as the result of the irradiation of the wafer 10 by the electron beam 21. A controller 30 drives the individual deflectors and coils.

Figure 7:
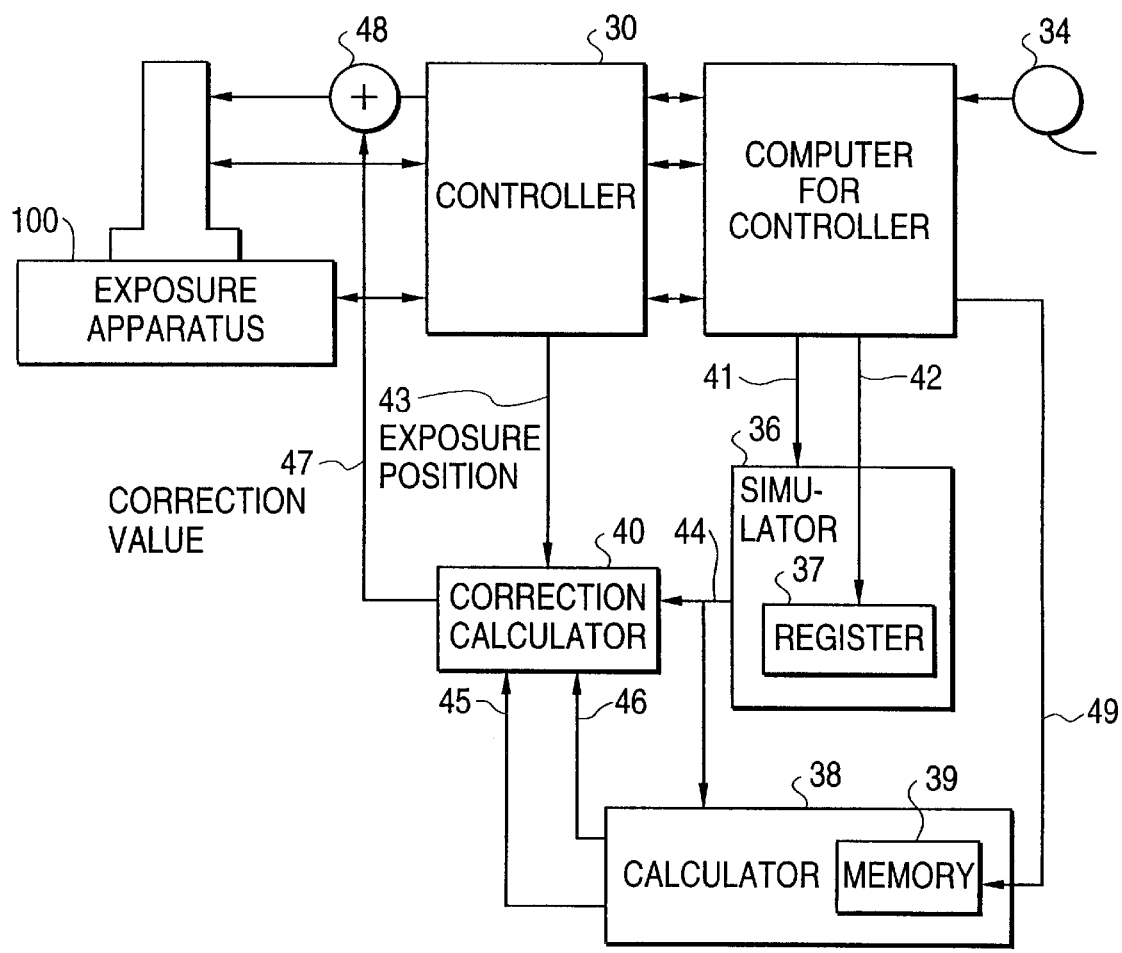
FIG. 7 is a block diagram illustrating an electron beam exposure apparatus according to a first embodiment of the present invention.

FIG. 7 is a schematic block diagram illustrating an electron beam exposure apparatus according to the first embodiment of the present invention. A main body 100 of the exposure apparatus includes the mirror barrel described above while referring to FIG. 6. The controller circuit 30 drives the beam deflectors in the mirror barrel. A computer 32 performs computations based on pattern data stored in a recording medium 34, such as a magnetic tape, and transmits to the controller 30 various control signals acquired in accordance with an exposure pattern. Based on the irradiation energy, a simulator 36 calculates a thermal expansion coefficient 44. A rotation/shifting distance calculator 38 calculates the distance the center position of the wafer 10 is shifted and a change in an angle of rotation. A correction value calculator 40 employs exposure position data 43 on the wafer 10, the thermal expansion coefficient 44, a shifting distance 45 for the wafer center, and an angle of rotation 46 to acquire a correction value for a deflected beam.

The simulator 36, the rotation/shifting distance calculator 38, and the correction value calculator 40 can be included in a program stored in the computer 32. Therefore, these functions may be implemented by separate hardware components, or may be included in a program that is to be executed by the computer 32.

Figure 8:
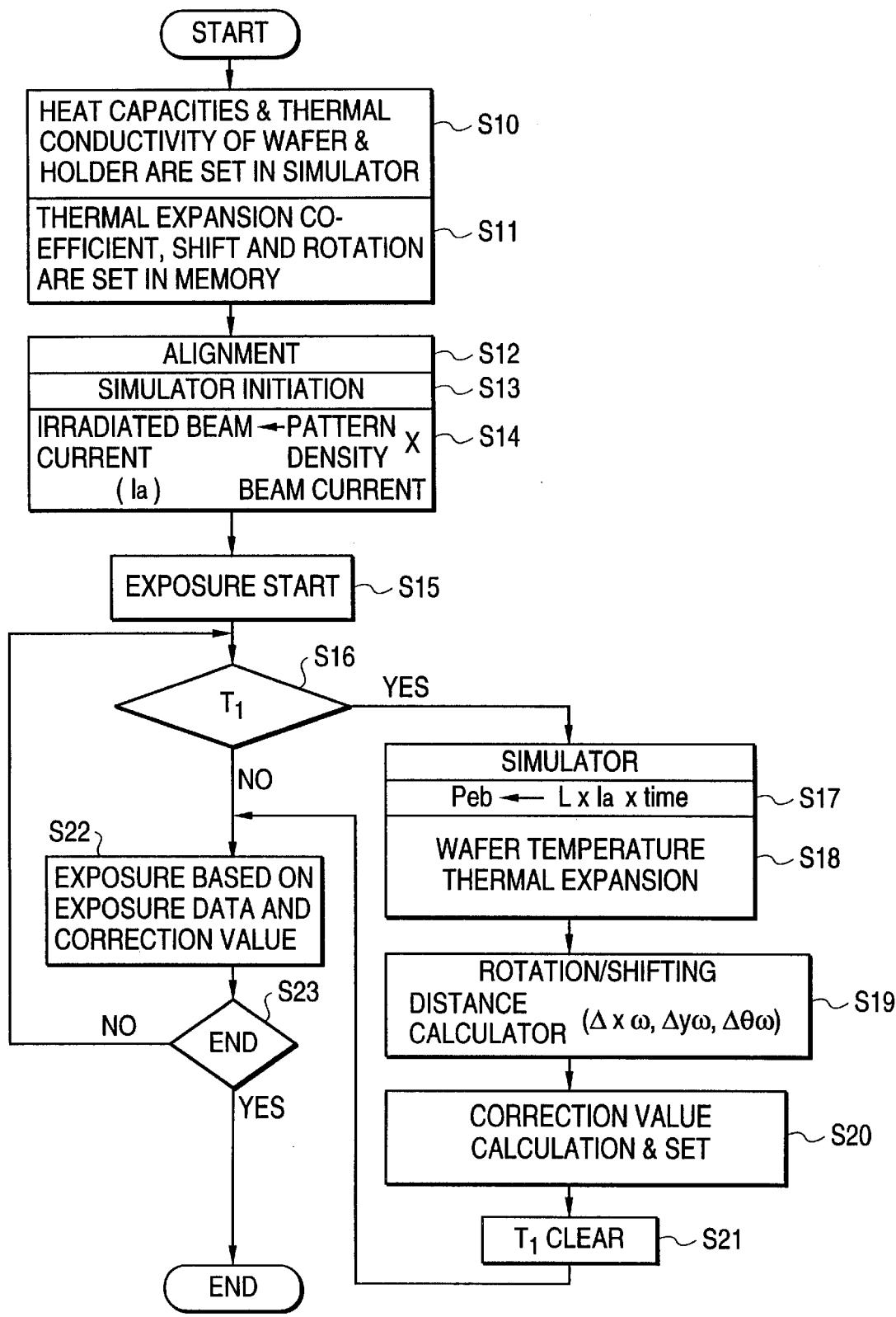
FIG. 8 is a flowchart for the processing of the first embodiment.

FIG. 8 is a flowchart for explaining an exposure process for correcting the thermal expansion of the wafer 10 while using the electron beam exposure apparatus shown in FIG. 7.

First, in the processing before the exposure procedure is begun, the heat capacities of the wafer 10 and of the holder 29, and the thermal conductivity between the wafer 10 and the holder 29 are acquired through experimentation, for example, and the resultant values are stored in a register 37 in the simulator 36 as data 42 for simulation (step S10). The data 42 are used to calculate the thermal expansion coefficient 44 by employing the above described simulation calculation method.

Further, as the preprocess, the shifting distance of the center position of the wafer and the change of the angle of rotation, which are occasioned by the thermal expansion of the wafer 10, are measured by conducting an experiment in advance. A table is prepared by using the results 49 as the function for the thermal expansion coefficient, and is stored in a memory 39 in the rotation/shifting distance calculator 38 (step S11). In this embodiment, it is assumed that in the exposure apparatus, the shifting distance for the center position of the wafer and a change in the angle of rotation will occur with a certain degree of reproducibility. If these values 48 are stored in the memory 39 in advance, the current shifting distance and the rotational distance can be acquired by the rotation/shifting distance calculator 38 using the thermal expansion coefficient 44, which is supplied by the simulator 36.

In the exposure process, alignment processing is performed for the wafer 10, and the exposure coordinate systems are determined (step S12). More specifically, positioning marks 13, which are already formed on the wafer 10, as is shown in FIG. 5, are detected to obtain the correlation between the position of the center O2 and the coordinate origin O1 of the exposure apparatus. In addition, the simulator 36 is initialized, and the hysteresis in memory, etc., is cleared (step S13). A beam current Ia used for irradiation is calculated from a beam current, which is to be supplied by the charged particle generator 20, and the pattern density of exposure data, and is stored in a memory 37, such as a register, in the simulator 36 (step S14). As for the pattern density of exposure data, for example, the pattern density for a single chip is calculated by the computer 32 based on exposure data supplied by an MT 34, and the product of the pattern density and the generated beam current value is employed to obtain a supplied beam current value per unit hour. Since patterns with which a plurality of chips on a single wafer are exposed are normally the same, the amount of the current of the irradiated beam is unchanged during the exposure of a single wafer.

The exposure is begun (step S15), and the start and the end of the exposure is reported as beam data 41 to the simulator 36. Assuming that a constant amount of the beam current Ia has been irradiated since the exposure was begun, the simulator 36 calculates cumulative thermal energy Peb supplied to the wafer 10 at every constant time division T1 (step S17). The thermal energy of the wafer 10 is calculated using the previous expression, and the heat capacity of the wafer 10, etc., is used to calculate the change in the temperature and the thermal expansion coefficient 44 (step S18). This calculation method was described previously. Letter L at step S17 denotes a coefficient obtained by experimentation.

The rotation/shifting distance calculator 38 calculates the shifting distance for the center position of the wafer 10 and the change in the angle of rotation, and supplies the shifting distance 45 and the rotational distance to the correction value calculator 40 (step S19). The correction value calculator 40 employs the thermal expansion coefficient 44, the shifting distance 45 and the rotational distance 46 to acquire the correction value for the deflector 27 (step S20). As is shown in FIG. 5, for the exposure at the position of (xa, ya), for example, the shifting distance for the center, ($\Delta$xw, $\Delta$yw, $\Delta\theta$w) is added to the shift obtained by using the thermal expansion coefficient 44 to acquire the correct exposure position (xb, yb). This correction value 47 is added to a drive current supplied to the beam deflection means 27 shown in FIG. 6. Reference numeral 48 denotes a typical adder.

[Second Embodiment]

Figure 9:
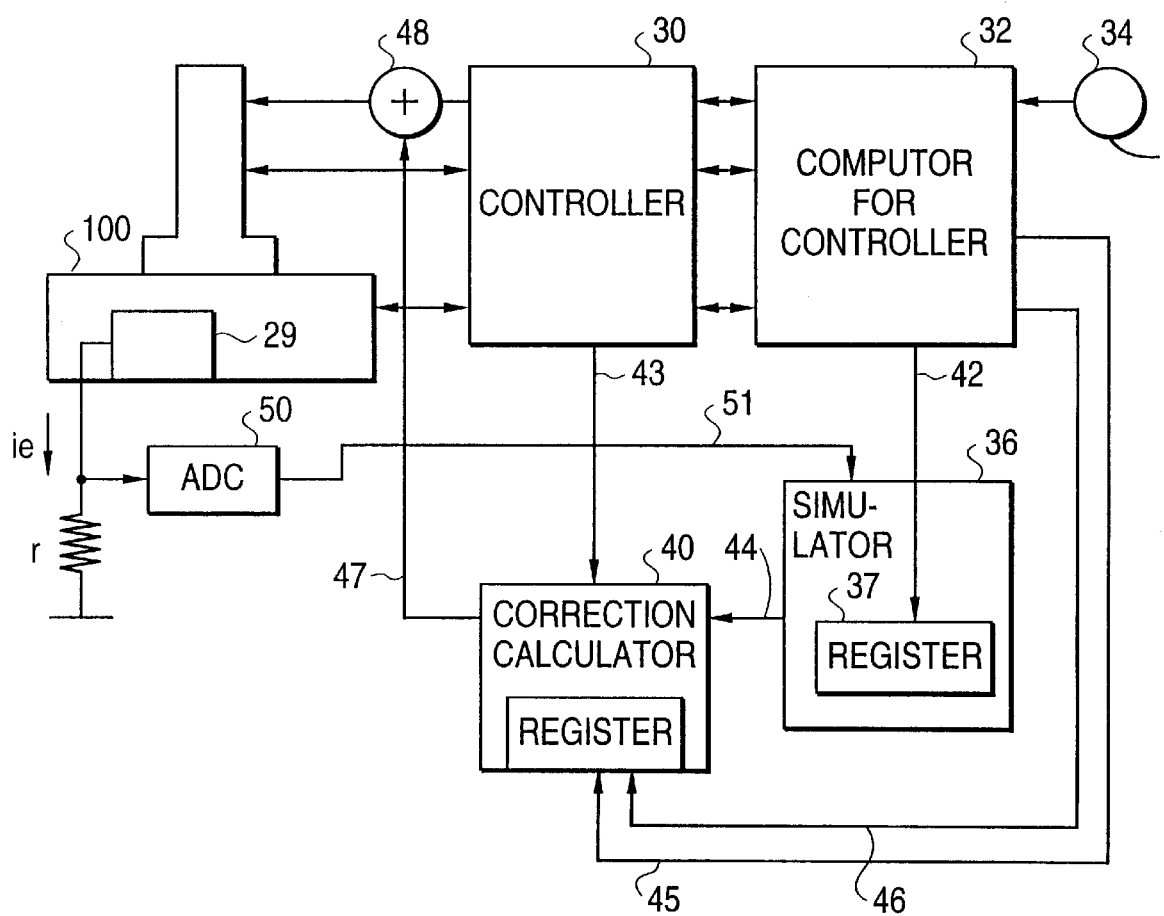
FIG. 9 is a block diagram illustrating an electron beam exposure apparatus according to a second embodiment of the present invention.

FIG. 9 is a schematic block diagram illustrating an electron beam exposure apparatus according to a second embodiment of the present invention. The same reference numerals as are used in FIG. 7 are also used to denote corresponding or identical components. The differences from the structure in FIG. 7 are that a shifting distance 45 for the center position of a wafer, and a rotational distance 46 are directly supplied from the computer 32 to a correction value calculator 40; and that a simulator 36 detects the strength of an irradiated beam current by using a current ie, which flows from a holder/stage 29 for a wafer to the ground, and acquires a thermal expansion coefficient. In the second embodiment, it is assumed that in the exposure apparatus the shifting distance for the center position of a wafer and the rotational distance, which accompany the thermal expansion, do not occur with reproducibility. The ordinary alignment process is performed for each predetermined period of time to detect marks on the wafer so as to obtain the shifting distance and the rotational distance. Reference numeral 50 denotes an A/D converter.

Figure 10:
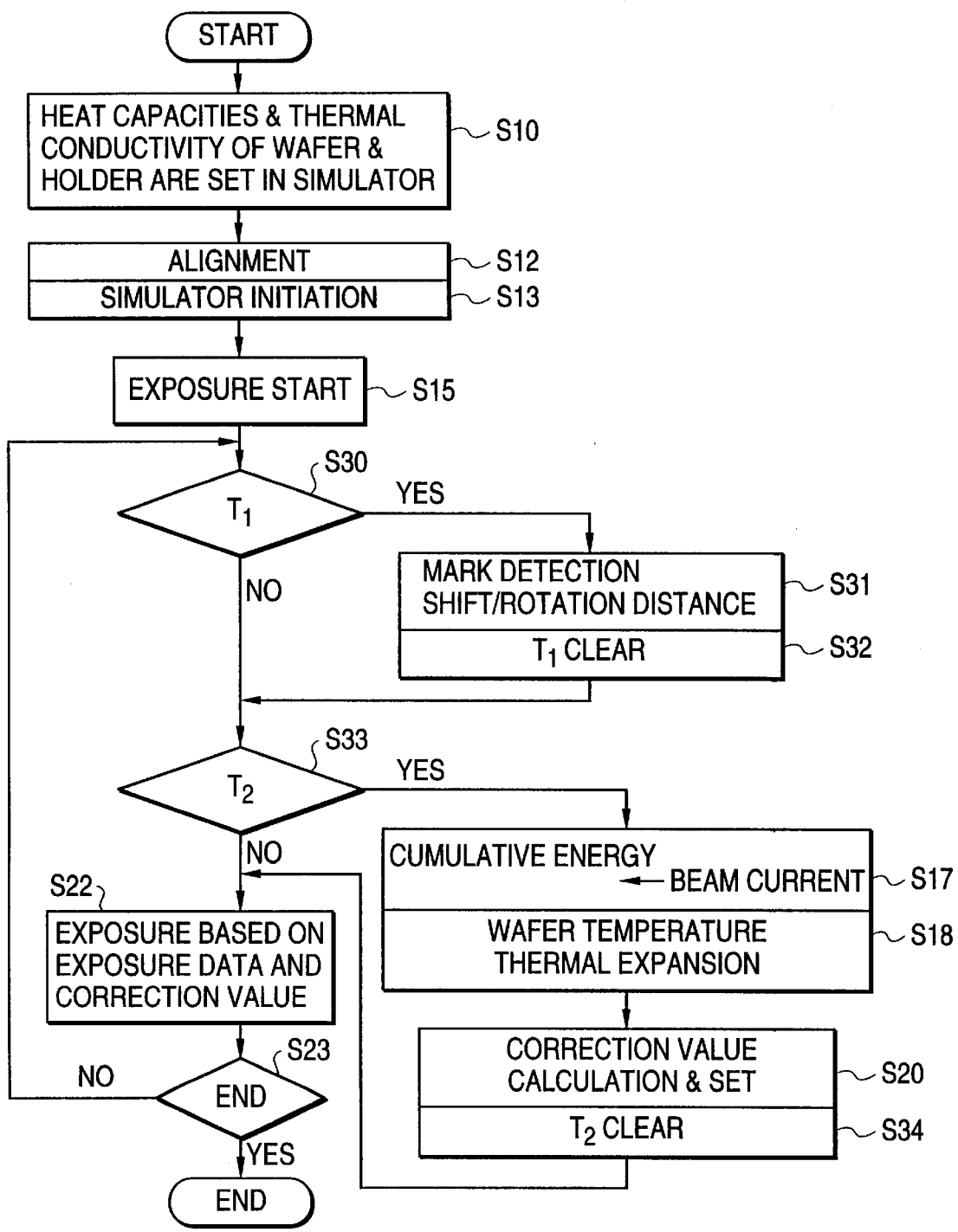
FIG. 10 is a flowchart for the processing of the second embodiment.

FIG. 10 is a flowchart for the second embodiment. The same reference numerals as are used in FIG. 8 are also used to denote corresponding or identical steps.

First, as the preprocess, experiments ares performed to measure the heat capacities of the wafer 10 and the holder 29, and the thermal conductivity between the wafer 10 and the holder 29, and the results are stored in a register 37 in the simulator 36 (step S10). The alignment process for the wafer (step S12) and the initialization of the simulation (step S13) are performed in the same manner as in the first embodiment.

The exposure is begun to supply the beam ON/OFF data 42 to the simulator 36. The simulator 36 calculates the strength of the irradiated beam current from the current ie, which flows from the stage 29 to the ground in consonance with the irradiation of the beam, and also acquires the cumulative energy quantity of the wafer, the change in the temperature of the wafer, and the thermal expansion coefficient by using the above described expressions (steps S17 and S18). The calculation of the thermal expansion coefficient is performed each predetermined time T2.

In this embodiment, the shifting distance for the center point O2 of the wafer 10 and the rotational distance ($\Delta$xw, $\Delta$yw, $\Delta\theta$w) are acquired by detecting the marks 13 on the wafer 10. The shifting distances 45 and cFlF stored in the register of the correction value calculator 40. Therefore, the procedure at step S31 is performed each predetermined time T1.

The thermal expansion coefficient 44, and the shifting distance 45 and the rotational distance 46 of the wafer 10, which are obtained in the above manner, are employed to calculate the correction value 47 for the irradiation position (step S20). The adder 48 adds the correction value 47 to a drive signal to be transmitted to the beam deflection means 27.

[Third Embodiment]

Figure 11:
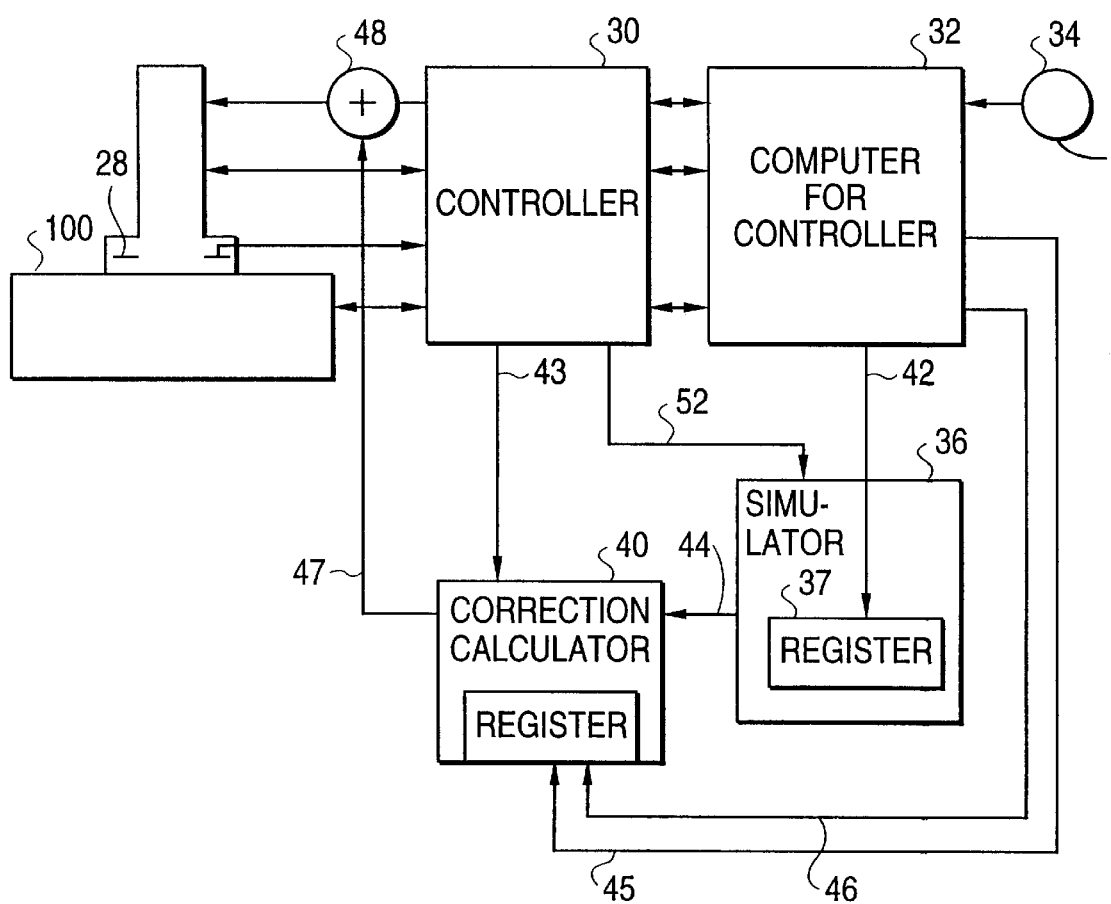
FIG. 11 is a block diagram illustrating an electron beam exposure apparatus according to a third embodiment of the present invention.

FIG. 11 is a schematic diagram illustrating an electron beam exposure apparatus according to a third embodiment of the present invention. The difference from the second embodiment in FIG. 9 is that, to detect the strength of an irradiated beam current, the quantity of the electrons reflected to the wafer 10 is detected by reflected electron detection means 28, and based on this electron quantity, an irradiated beam current 52 is supplied to a simulator.

The reflected electrons are detected during the detection of the positions of marks 13, made of metal film, which are formed on a wafer 10. That is, the marks 13 are scanned by a beam, and electrons reflected at a metal film mark 13 having a large reflection coefficient are measured to find the position of that mark 13. Therefore, the reflected electron detection means is not required in this embodiment for detecting the present strength of an irradiated beam current.

As is described above, according to the present invention, the problem concerning the thermal expansion of a wafer can be resolved when the throughput is improved by increasing the strength of a beam current, until the limit of the microstructure is reached, in order to perform drawing directly on a wafer by irradiation with an electron beam. The correction value for a beam irradiating position relative to the thermal expansion of the wafer is obtained and is provided for the beam deflection means, so that a highly integrated semiconductor circuit can be exposed with a high throughput.

The present invention can be applied not only to an exposure using an electron beam, but also to an exposure using any other charged particle beam that projects thermal energy to a sample. In addition, the present invention can not only be used for the exposure process for the semiconductor integrated circuit, but can also be used for the exposure process for a sample that requires another microstructure.

[Fourth Embodiment]

The problem concerning the thermal expansion, which accompanies a rise in the temperature of a wafer that is caused by irradiation with an electron beam, can be resolved by a continuous wafer movement method according to which a wafer is divided into a plurality of exposure unit areas, and each time an individual unit area is exposed, with the wafer in continuous movement, alignment marks on the wafer are detected to enable the refreshing of a correction value. In this case, the size of each division area must be so set that the thermal expansion of the wafer during the exposure of a specific division area is less than the upper limit in a permissible range. That is, a wafer is divided into a plurality of exposure unit areas having a permissible size, a correction value for thermal expansion is acquired for each area, and exposure is performed in the individual areas by the continuous wafer movement method.

The division areas should have a single chip area as the minimum unit. If the wafer is divided in a way of cutting into chip areas, correction values for different thermal expansions will be used for the same chip, and the continuation of the pattern at the boundary is not appropriate. A fourth embodiment of the present invention will now be described while referring to FIGS. 12 through 19.

Figure 12:
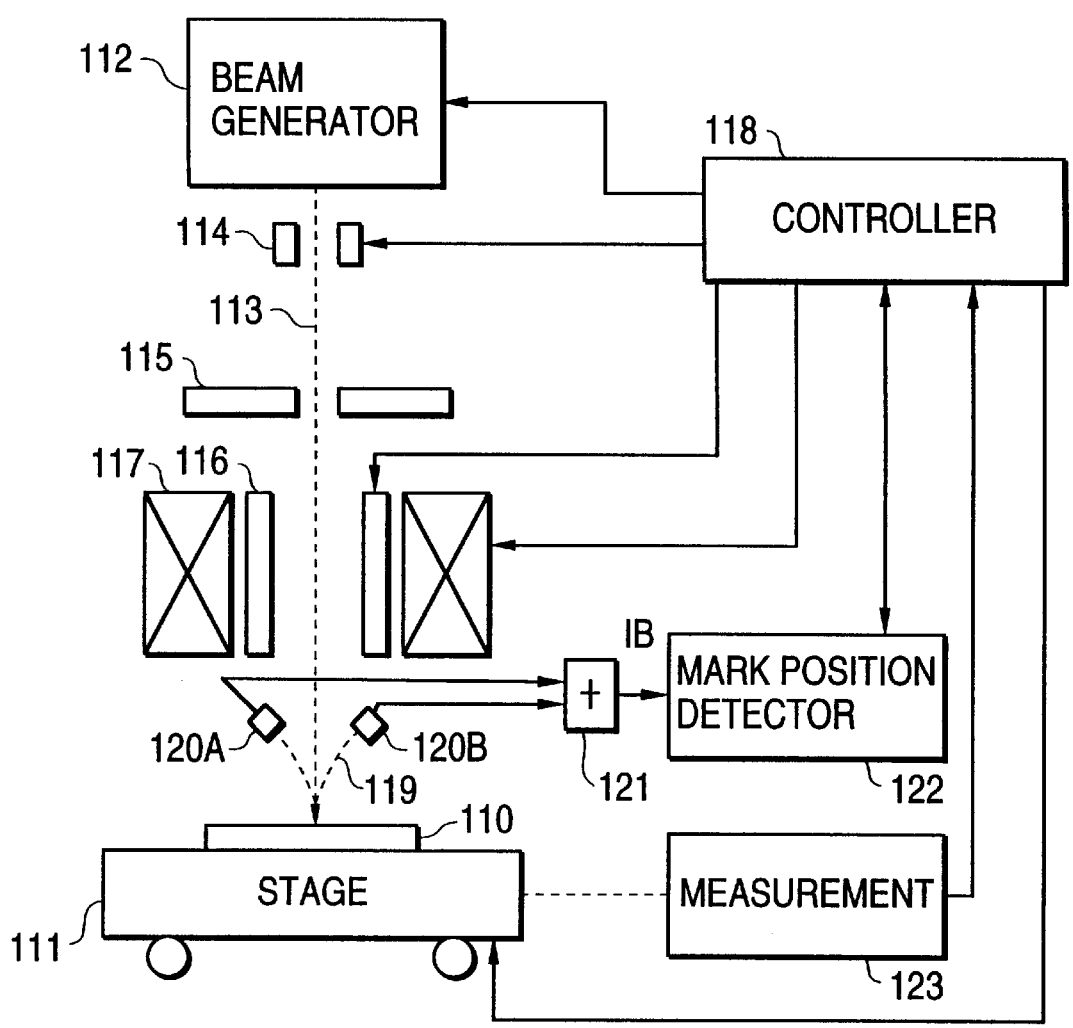
FIG. 12 is a schematic diagram illustrating the arrangement of a electron beam exposure apparatus according to a fourth embodiment of the present invention.

FIG. 12 is a schematic diagram illustrating a charged particle beam exposure apparatus according to the fourth embodiment of the present invention.

A semiconductor wafer 110, the target for irradiation, is mounted on a moving stage 111. A charged particle beam 113 is emitted by a charged particle beam emission apparatus 112 and passes through blanking deflectors 114, apertures 115, electrostatic deflectors 116, which serve as sub-deflectors, and electromagnetic deflectors 117, which serve as primary deflectors, and irradiates the semiconductor wafer 110. A controller 118 controls the shape of the cross section of the charged particle beam 113, the irradiation or non-irradiation of the semiconductor wafer 110 with the charged particle beam 113, the position on the semiconductor 110 that is to be irradiated by the charged particle beam 113, and the moving of the stage 111.

Secondary electrons 119 emitted at the location on the semiconductor wafer 110 that is irradiated with the charged particle beam are detected by secondary electron detectors 120A and 120B. The outputs from the two detectors 120A and 120B are added together by an adder 121, and the result is supplied as a secondary electron detection amount IB to a mark position detector 122. The position of the stage 111 is measured by a laser interferometer 123, and the result is supplied to the controller 118.

Figure 13A:
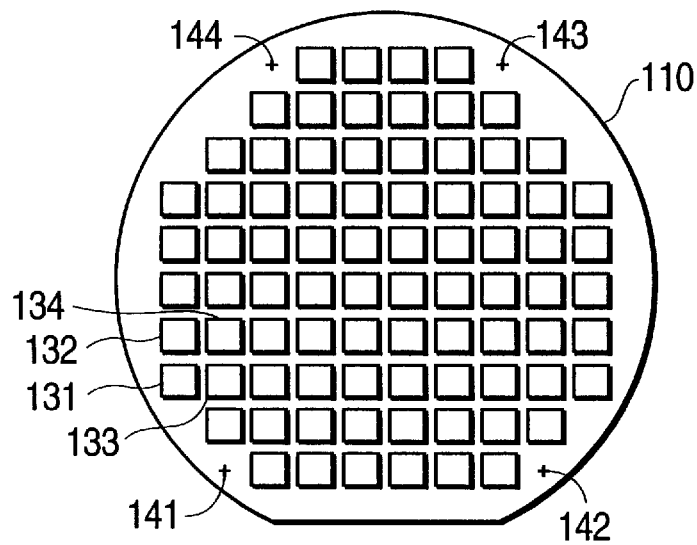
FIGS. 13A and 13B are diagrams showing chip areas and alignment marks on a semiconductor wafer.

As is shown in FIG. 13A, chip areas (areas corresponding to chips before the wafer is cut into chips) are arranged as a matrix on the semiconductor wafer 110, and areas 131 through 134 are these chip areas. Since a resist pattern is formed over a pattern that has already been formed in each chip area, the positioning of the upper and lower patterns is required, and alignment marks 141 through 144 are therefore formed on the semiconductor wafer 110.

In FIG. 12, the charged particle beam 113 is deflected by the electrostatic deflectors 116 to scan these alignment marks 141 through 144, and changes in the detected quantities of the secondary electrons is obtained by the mark position detector 122. The positions of the alignment marks 141 through 144 are determined by using the detection results and the positions scanned by the charged particle beam 113, which is obtained by the stage 111, the electrostatic deflectors 116 and the electromagnetic deflectors 117.

Since after the annealing process, etc., is performed for the semiconductor wafer 110, it is coated with a resist and is exposed, the chip areas are deformed at the micropattern level. As this deformation varies depending on the locations on the semiconductor wafer 110, by employing only the alignment marks 141 through 144 accurate positioning of the upper and lower patterns can not be provided.

Figure 13B:
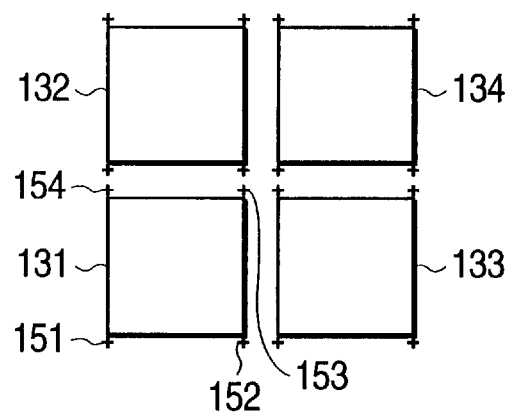

As is shown in FIG. 13B, therefore, alignment marks 151 through 154 are formed for each chip area, and these positions are measured in the same manner as are the alignment marks 141 through 144, and are used for the positioning of the upper and lower patterns (Japanese Unexamined Patent Publication No. Sho 54-118777).

Figure 14:
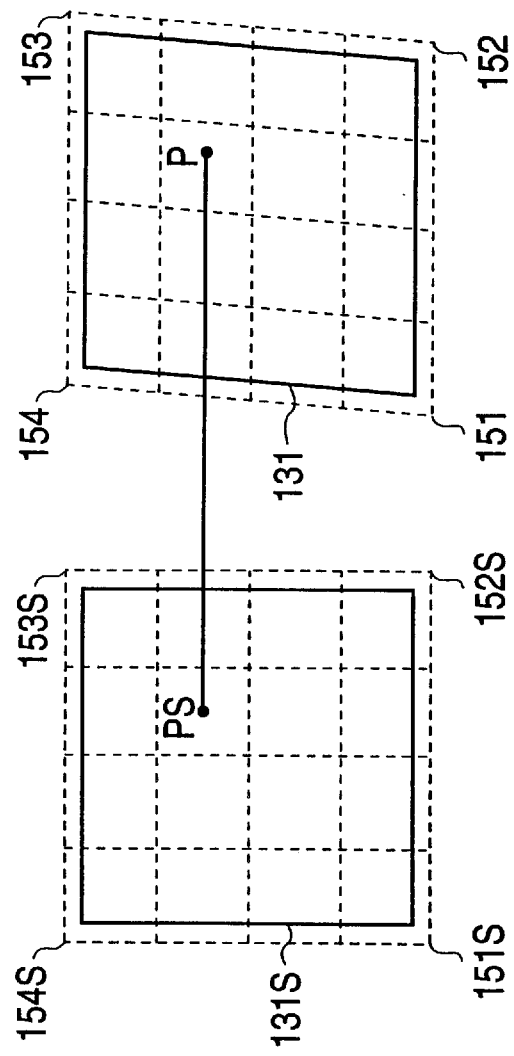
FIG. 14 is a diagram showing the correspondence between a position on a design and an actual position.

FIG. 14 is a diagram showing an example where the chip areas are deformed by thermal expansion. The left side in FIG. 14 is a chip design, while the right side is a deformed chip. Parameters for coordinate transformation are determined so that the positions of chip alignment marks 151S through 154S correspond to the measured positions for the chip alignment marks 151 through 154. By using this coordinate transformation expression, arbitrary position PS in a chip area 131S on the design corresponds to position P in the actual chip area 131, thereby positioning the upper and lower patterns. This coordinate transformation is performed by a deflector driver in the controller 118. The coordinate transformation expression is determined by setting the above obtained parameters to the register in the deflector driver. While gain G, rotation R, trapezoid distortion H and offset O are used as parameters, the expression for transforming coordinates (X, Y) into (Xp, Yp) is represented as follows:

$Xp=GxX+RxY+HxXY+Ox$ $Yp=GyY+RyX+HyXY+Oy.$

As the charged particle beam 113 is irradiated, its energy is absorbed by the semiconductor wafer 110, and the temperature of the wafer 110 is raised. According to the continuous movement method, a period from the time alignment mark measurements for the chip are made until the time the chip areas to which the chip alignment marks belong were exposed becomes longer. During this period, thermal expansion is caused by the rise in temperature, and accordingly, by the time of the exposure, the positions of the chip alignment marks have been shifted away from the calculated locations, and the accuracy of the alignment of the upper and lower patterns is deteriorated. Although this shift varies in consonance with the location on the semiconductor wafer 110, it has been found through measurement that the maximum shift value is approximately 0.05 μm. Since the accuracy of the positioning of the upper and lower patterns must be equal to or less than ⅒ of the pattern processing accuracy, this shifting value can not be ignored.

Figure 15A:
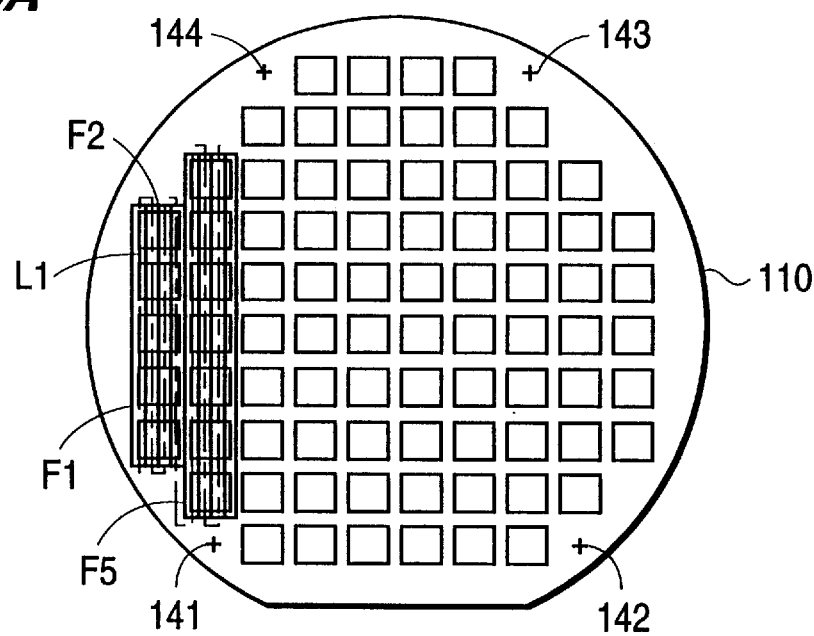
FIGS. 15A, 15B and 15C are diagrams for explaining a charged particle beam scanning method.
Figure 15B:
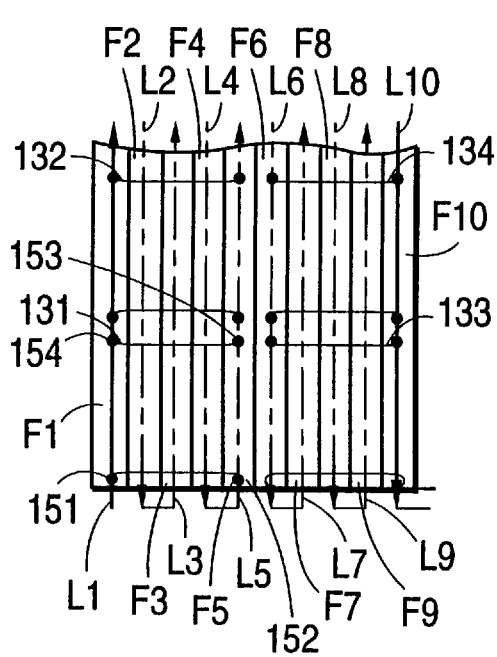
Figure 15C:
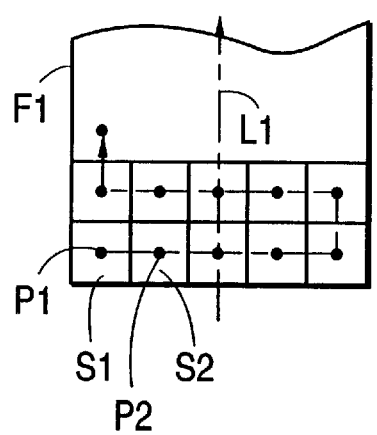

FIGS. 15A through 15C are diagrams showing the scanning procedure using the continuous wafer movement method. FIG. 15A is a diagram showing the entire wafer 110; FIG. 15B is an enlarged diagram of one part in FIG. 15A; and FIG. 15C is an enlarged diagram showing one part of frame F1 in FIG. 15B.

Frames F1 through F10 run parallel to the rows of chips, and their widths are within a deflection range for the electromagnetic deflectors 117. As the stage 111 is continuously moved in the named order along stage scan lines L1 through L10, which are the center lines of frames F1 through F10, the exposure process is performed.

As is shown in FIG. 15C, while the stage 111 is moved along stage scan line L1, the charged particle beam 113 is deflected by the electromagnetic deflectors 117 to a center P1 (main deflection position) of sub-field S1, and the sub-field S1 is scanned by the electrostatic deflectors 116. Although the main deflection position P1 is shifted in accordance with the movement of the stage 111, this shift is fed back to the electrostatic deflector 116 to correct for the deflection. When the sub-field S1 has been scanned, a step change in the deflection performed by the electromagnetic deflectors 117 is made from the primary deflection position P1 to a position P2, and sub-field S2 is then scanned by the electrostatic deflectors 116. The above described process is repeated. The width of frame F1 is 2 mm, and the width of the sub-field S1 is 100 μm, for example.

As is apparent from the continuous movement of the wafer, the route of the continuous movement must be taken into consideration in order to divide the wafer into a plurality of unit areas for which thermal expansion falls within a permissible range. Therefore, the strength of the beam employed for irradiation is used to determine the maximum count of the chip areas to be exposed before the positioning shift due to thermal expansion exceeds the permissible range.

Figure 16A:
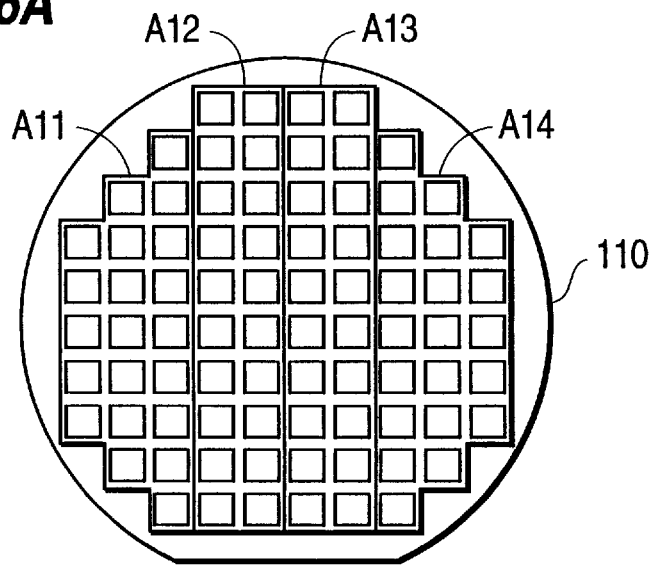
FIGS. 16A and 16B are diagrams illustrating examples of divided exposure unit areas.
Figure 16B:
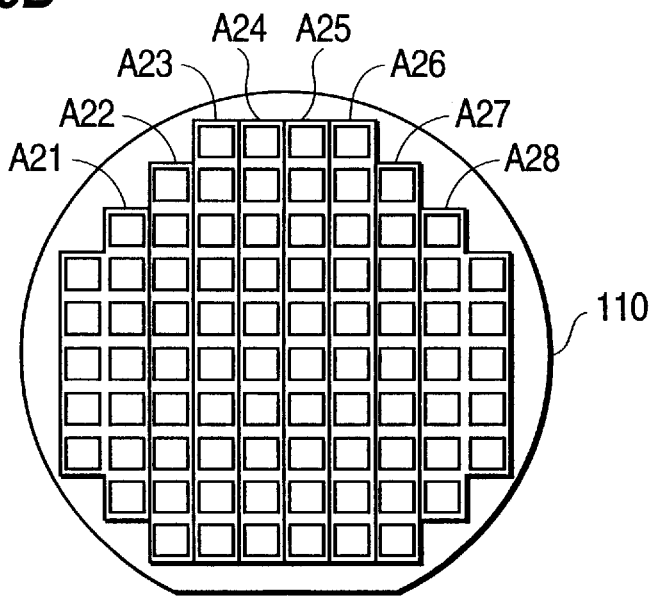
Figure 17:
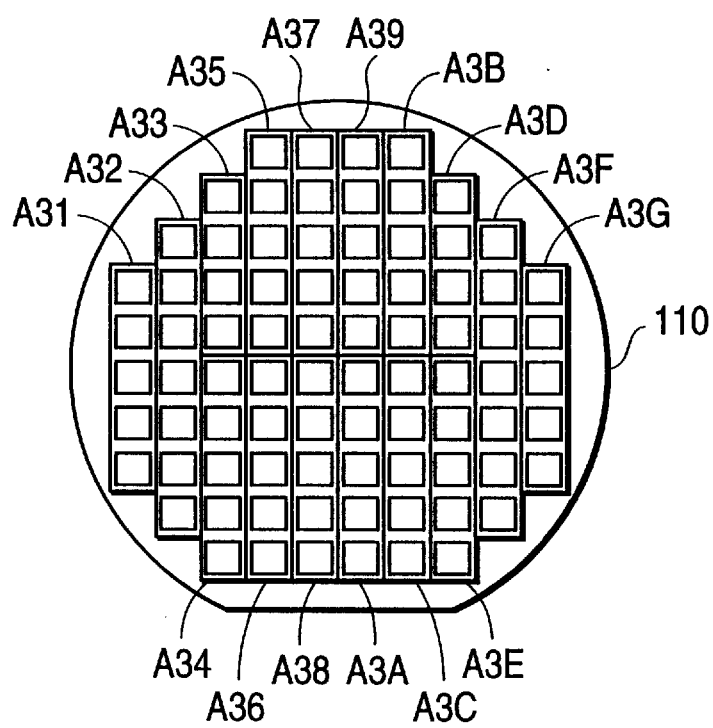
FIG. 17 is a diagram illustrating an example of the divided exposure unit areas.

FIGS. 16A, 16B and 17 are diagrams showing examples of exposure unit areas obtained by dividing the wafer. In FIG. 16A is shown an example where the maximum chip area count n, for which thermal expansion falls within the permissible range, is 23. In FIG. 16B is shown an example where the maximum chip area count n is 11. In these examples, the wafer 110 is so divided that the maximum n chip areas are provided along the frame in the direction in which the wafer 110 is moved.

In FIG. 17 is an example where the maximum chip area count n is eight. In this example, since some columns running from the upper end to the lower end of the wafer 110 include more than eight chips, those columns (chip strings) are further divided. The algorithm for these divisions will be described later.

Figure 18:
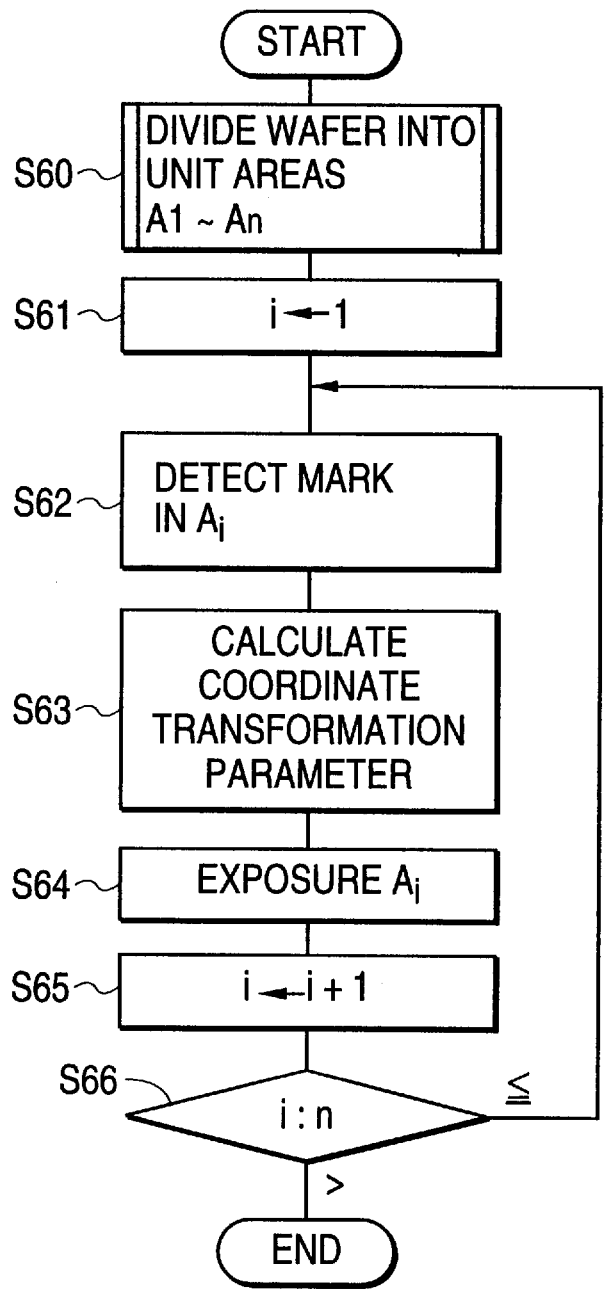
FIG. 18 is a schematic flowchart showing the procedures for exposing a semiconductor wafer.

FIG. 18 is a flowchart showing the exposure processing for the semiconductor wafer 110.

(step S60) The semiconductor wafer 110 is divided into exposure unit areas A1 through An. For this division, in principle, one chip string is defined as a unit and a chip area is defined as a minimum unit, which will be described later. As is shown in FIG. 16A, for example, the semiconductor wafer 110 is divided into areas A11 through A14.

(step S61) In the initial state, area identification variable i is set to "1.".

(step S62) The positions of the chip alignment marks in area Ai are detected in the above described manner.

(step S63) In consonance with the detected positions, the above described coordinate transformation parameters are calculated for each chip area.

(step S64) The area Ai is exposed. At this time, the coordinate transformation parameters are set in the register for each of the individual chip areas that are exposed. Since thermal expansion of the wafer during the exposure of the area Ai falls within the permissible range, the coordinate transformation parameters G, R, H and O, which are obtained at steps S62 and S63, are employed to adequately correct the deflection position.

Although the semiconductor wafer 110 is expanded by the irradiation with the charged particle beam 113, and the pattern is shifted at the border line of adjacent frames, as scanning is sequentially performed in order for the adjacent frames, so that this shift is small.

(step S65) i is incremented by one.

(step S66) When i≦n, program control returns to step S62, and the above process is repeated. When i>n, the exposure processing is terminated.

As is described above, the process at steps S62 through S64 is performed for each area Ai. Therefore, the shifting, due to the thermal expansion, relative to the positions of the chip alignment marks that are calculated at step S62, is smaller than conventional shifting, and the shifting of the positioning of the upper and the lower patterns can be reduced. In addition, since the area Ai is prepared while a chip string is defined, in principle, as a unit, the continuous movement of the stage 111 at step S64 is not interrupted, and deterioration of the exposure throughput is prevented. Further, since an area is formed by using, as a unit area, an area of at least one chip, the measurements for the positions of alignment marks on the same chip need be conducted only one time, and deterioration of the throughput is thereby prevented.

Figure 19:
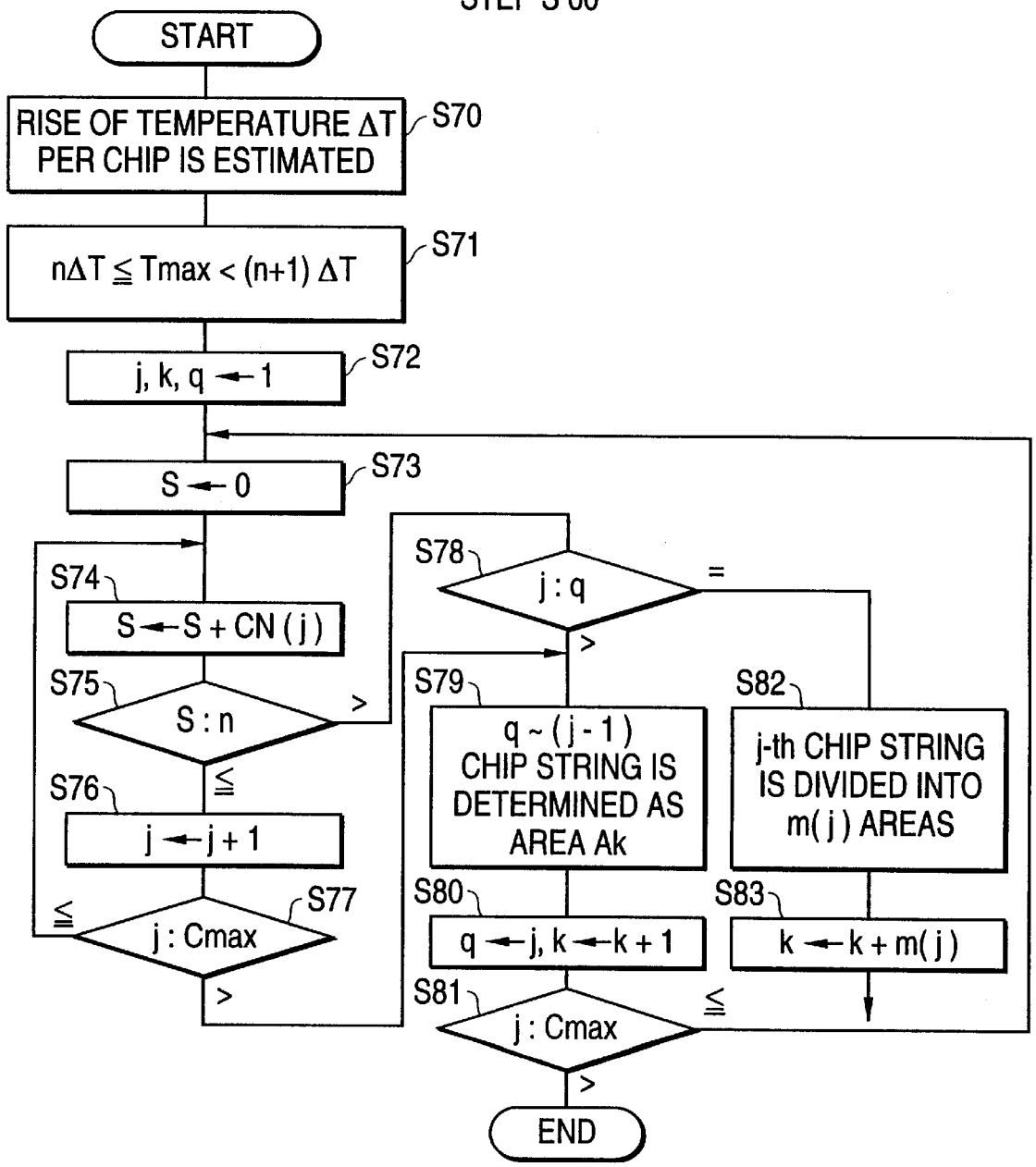
FIG. 19 is a detailed flowchart for the procedure at step S60 in FIG. 18.

The algorithm for dividing the wafer 110 into areas A1 to An at step S60 will now be explained while referring to FIG. 19.

(step S70) The rise in temperature, $\Delta T$, per chip area of the semiconductor wafer 110, which occurs due to the irradiation of the semiconductor wafer 110 by the charged particle beam 113, is estimated. For example, under the worst conditions, where no heat is discharged from the semiconductor wafer 110, the rise in temperature, $\Delta T$, is calculated as follows:

$$\Delta T = S \cdot R \cdot V / \sigma,$$

where

S: dimension ($cm^2$) of one chip area

R: the dose ($C/cm^2$) of a beam provided by a resist sensitivity

V: acceleration voltage (J/C)

$\sigma$: specific heat of semiconductor wafer 110.

(step S71) The maximum count n of chips included in the exposure unit areas A1 to An is acquired. More specifically, n is determined that satisfies n $\Delta T \leq TMAX < (n+1)\Delta T$. TMAX is the upper limit value in the permissible range of the rise in temperature, and corresponds to the upper limit value of a permissible range for displacement of the semiconductor wafer 110, which is caused by thermal expansion. For example, since TMAX$\alpha$L=L$\Delta$MAX, TMA is calculated by the expression:

$$TMAX = \Delta LMAX / \alpha L,$$

where $\Delta$LMAX: permissible upper limit value of displacement $\alpha$: linear expansion of semiconductor wafer 110

L: diameter of semiconductor wafer 110

(step S72) In the initial state, a "1" is set to variables j, k and q that are used hereinafter: with j being a chip string identification variable; k, an unit area identification variable; and q, a variable for determining whether unit area division is performed within one chip string.

(step S73) Area division determination variable S is cleared.

(step S74) Count CN(j) of the j-th chip string is added to variable S.

(step S75) When S≦n, program control advances to step S76. When S>n, program control moves to step S78.

(step S76) j is incremented by one.

(step S77) When j≦CMAX, program control returns to step S74. When j>CMAX, program control goes to step S79.

CMAX is the total number of chip areas on the semiconductor wafer 110.

(step S78) When j>q, program control moves to step S79. When j=q, program control goes to step S82.

(step S79) The area from the q-th through the (j−1)-th chip strings is determined as area Ak.

Through this process, when n=23, for example, the areas A11 through A14 are prepared as is shown in FIG. 16A. When n=11, the areas A21 through A28 are prepared as is shown in FIG. 16B.

(step S80) j is substituted into q, and k is incremented by one.

(step S81) If j≦CMAX, program control returns to step S73. If j>CMAX, the processing is terminated.

(step S82) The j-th chip string is divided into m(j) areas.

Although normally the wafer is divided into units of chip strings, one chip string may be further divided, depending on the energy of a charged particle beam, resist sensitivity and pattern density.

When n=8, in FIG. 17, the areas A31, A32, A3F and A3G can be provided by a single chip string, while the other chip strings must be further divided because the number of the chip areas they contain is greater than n. In FIG. 17, the areas A33 through A3E are provided by dividing chip strings in two.

Although one chip string can be divided into areas of n chip areas each and a final area containing the remainder of the chip areas, equal division as performed in FIG. 17 is preferable because the maximum value of the thermal expansion due to a rise in the temperature can be reduced.

(step S83) k is incremented by m(j), and program control returns to step S73. The present invention includes various other modifications.

For example, the scanning method is not limited to the method shown in FIG. 15C. Deflection affected by the electromagnetic deflectors 117 may be sequentially performed to enhance the throughput. The present invention can also be applied to a wafer where a chip alignment mark is formed for each group of chip areas. Yet even when chip alignment marks are formed for each chip area, the measurements to determine their positions are not necessarily performed for all the chip areas; three or more position measurements may be obtained for the division areas. Further, instead of the permissible upper limit value TMAX for a rise in the temperature, the upper limit value for a corresponding scanning period or for a scanning area may be used. Since TMAX is a rough value, an operator may determine TMAX or number n according to an empirical rule and input them, or an operator may divide a wafer into areas on a display screen.

[Fifth Embodiment]

When a wafer is to be exposed directly to an electron beam, the intensity of the beam must be increased to enhance the throughput. The rise in the temperature of the wafer that accompanies the increase in the beam intensity can be resolved by using the above described methods, but the problem of beam drift that is caused by an increase of the beam intensity can not be ignored. FIG. 20 is a schematic diagram for explaining beam drift.

In a charged particle beam exposure apparatus, as is shown in FIG. 20, a semiconductor wafer 211 is mounted on a moving stage 210, and electrostatic deflectors 212 are located above it to serve as sub-deflectors. A charged particle beam 213 passes through the electrostatic deflectors 212 and irradiates the semiconductor wafer 211. The semiconductor wafer 211 is coated with a resist, and a part of it, which is evaporated when it is irradiated by the charged particle beam 213, attaches itself as contamination 214 to the electrostatic deflectors 212. A charge-up phenomenon then occurs where electric charges accumulates in the contamination 214. This attachment of the contamination 214 also occurs when other portions of the resist are irradiated by the charged particle beam. In FIG. 20 is shown as a specific example of the contamination 214.

Since electric field strength EC, formed by the charge-up of the contamination 214, is superimposed on electric field strength E, formed by the electrostatic deflectors 212, beam drift due to the electric field strength EC occurs, resulting in the deterioration of the exposure pattern accuracy. This problem becomes increasingly critical as the microstructure of a circuit device is developed.

Since the beam drift distance can not be measured unless the charged particle beam scans the marks on the semiconductor wafer, the beam drift distance can not be obtained during the exposure process, and conventionally, can not be corrected.

Thus, conventionally, beam drift is measured in the above manner after the exposure process has been completed. And when the beam drift distance is equal to or greater than a predetermined value, the charged particle beam optical system is disassembled and washed, or oxygen is introduced into the charged particle beam exposure apparatus and ashing is performed, by applying an RF voltage to an internal electrode, to remove the contamination.

However, the performance of this process must be delayed until the following procedures are completed: a charged particle gun is turned off, the vacuum in a mirror barrel is released, the mirror barrel is set in the vacuum state after being washed, the charged particle gun is turned on and a charged particle beam becomes stable. Therefore, the apparatus is inactive for at least several hours, and since this period is not precise, the productivity is considerably deteriorated.

This problem can be resolved or limited by correcting for beam drift caused by a charge-up. However, the phenomenon and behavior of beam drift due to a charge-up are complicated, and it is difficult to measure beam drift and acquire a correction value during the exposure process. The present inventors analyzed the phenomenon of beam drift due to a charge-up and found that a model of a specific electric circuit can be applied.

FIG. 21 is a graph showing the results of the measurement of beam drift caused by a charge-up. The horizontal axis represents the time (minutes), and the vertical axis represents the distance (nm) a beam spot was displaced on the semiconductor wafer 211 due to the charge-up. The results of the measurements were obtained in the following manner.

In FIG. 20, the charged particle beam 213 was turned off until it was assumed that the charge-up no longer exist. Then, the charged particle beam 213 was turned on, and while a constant current value was maintained, the procedures at steps [1] and [2] were repeated for five minutes.

Step [1]: The charged particle beam 213 was deflected by the electrostatic deflectors 212 and scanned the marks on the semiconductor wafer 211, and with E=0 relative to the marks, the positions of the beam spots on the stage 210 were measured.

Step [2]: The voltage to be applied to the electrostatic deflectors 212 was set to 0, and the semiconductor wafer 211 was irradiated by the charged particle beam 213.

While irradiation by the charged particle beam 213 was being performed, step [1] was repeated intermittently. Then, irradiation by the charged particle beam 213 was halted, and step [2] was repeated intermittently.

The following conclusions were drawn from the results of the measurements in FIG. 21.

(1) With the charged particle beam 213 on, the contamination 214 was charged up and was saturated at a value corresponding to the intensity of the beam 213. Then, when the beam 213 was turned off, the electric charge was gradually dispersed.

(2) The time constants for charging/discharging were comparatively large, with the time constant for discharging being larger than was that for charging.

Figure 22A:
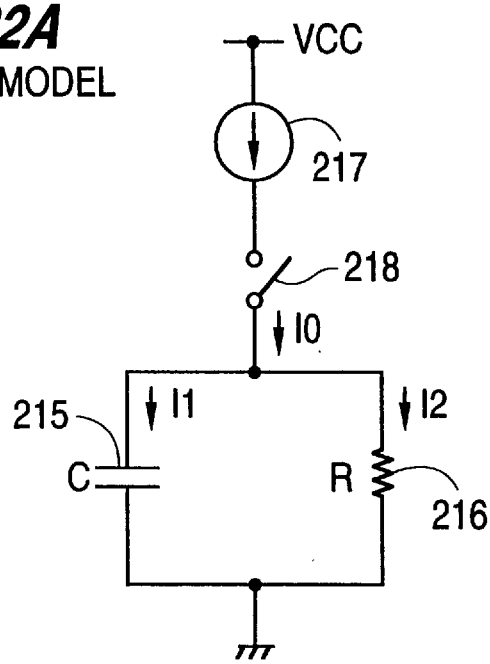
FIGS. 22A and 22B are a diagram and a graph for explaining a charge-up model.

FIG. 22A is a diagram showing a charge-up model employing the electric circuit that the present inventors devised. In this model, a capacitor 215 and a resistor 216 are connected in parallel, and this circuit, a constant current source 217 and a switch 218 are connected in series between a power feed line VCC and a ground line.

When the switch 218 is turned on, constant current I0 is output by the constant current source 217 and branches to provide current I1 flowing toward the capacitor 215 and current I2 flowing toward the resistor 216.

In this electric circuit, the following relationships are established: 26; 2548 pG $$I1+I2=I0, V=Q/C=I2\ R,\ I1=dQ/dt,$$

where C denotes a capacity of the capacitor 215, R denotes a resistance of the resistor 216, and Q denotes the amount of the electric charge accumulated by C.

Figure 22B:
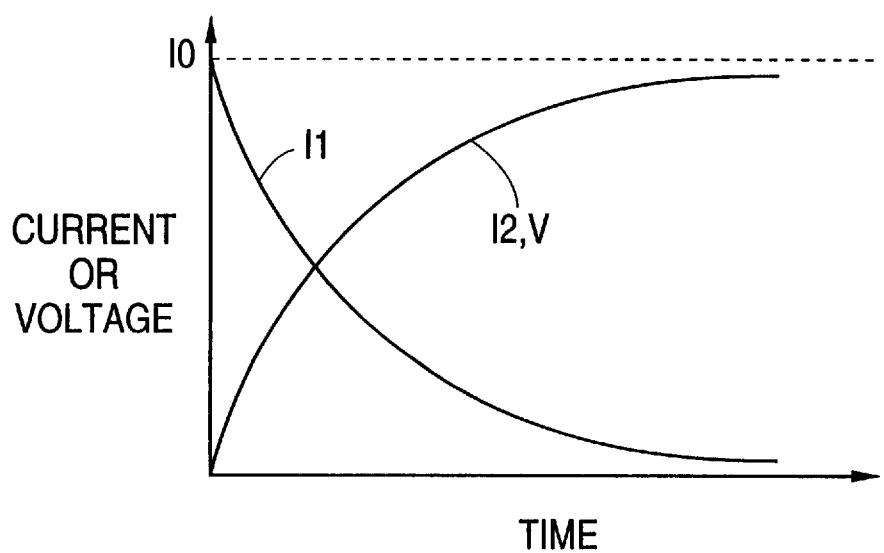

Since Q=0 when the switch 218 is turned on, V=0, I2=0 and I1=0. The electric charge Q is increased and the voltage V at the capacitor C is saturated at a specific value, while the current I1 converges to 0 and the current I2 converges to current I0. The changes in the current I1 and in the current I2 relative to the voltage are shown in FIG. 22B. When the switch 218 is turned off after the current I2 has converged to the current I0, the electric charge Q on the capacitor 215 is discharged and flows across the resistor 216, and the current V and the current I2 converge to 0. The waveform for the voltage/current I2 is the same as that for the current I1 in FIG. 22B.

In this model, assuming that with the switch 218 on, part of the current I0 flows across the capacitor 215 and also the electric charge on the capacitor 215 is discharged to the resistor 216, for the charge on the capacitor 215 is discharged regardless of whether the switch 218 is turned on or off. Assuming that, referring to FIG. 20, the current I0 corresponds to the current of the charged particle beam 213, the electric charge Q on the capacitor 215 corresponds to the cumulative charge held by the contamination 214 and the discharge from the capacitor 215 corresponds to the discharge from the contamination 214, the beam drift phenomenon according to 0Y;0ssFsF which the charging and discharging due to the charge-up are performed can be reproduced by using the electric circuit model shown in FIG. 22A. Since the electric charge Q is proportional to the electric field strength EC, a correction value can be obtained that corresponds with the intensity of the charged particle beam 213. It should be noted that since the factors that do not exist in the electric model exist in the beam drift that is due to a chust be corrected. Although time constant τ for this electric circuit model is a value CR for both the charging and the discharging, the time constants for the beam drift due to the charge-up differ between the charging and the discharging. Accordingly, the electric circuit should be so corrected that, for example, the resistance R differs between the charging and the discharging. The charging relative to the contamination 214 depends on the deflection of the charged partible beam 214 by the electrostatic deflectors 212. As the deflection distance becomes larger, the charge-up (charging) of the contamination 214 increases. This should be taken into consideration. It is presumed that the time constant τ varies depending on the environment in the actual exposure apparatus, where the charge-up source, such as the surface of the deflection electrode, receives an electric charge and is saturated, and where the electric charge is discharged from the charge-up source, which is in turn attenuated. Specifically, when the charging condition exists, it indicates that irradiation with a high speed electron beam is being performed, and when the discharging condition exists, it indicates that no irradiation with the electron beam is being performed. It is therefore presumed that the presence of the electron beam affects the change in the time constant.

As is described above, the change in the voltage of the charge-up source can generally described by using the equivalent circuit in FIG. 22A, and the beam drift distance due to the charge-up is proportional to the voltage. Thus, the drift distance can be obtained by a filter circuit employing the equivalent circuit model in FIG. 22A. When, for example, an electric charge of reflected electrons is accumulated by a charge-up source, it is assumed that the reflected electron strength is proportional to the volume of the current flowing into the charge-up source. The potential of the charge-up source relative to the change in the volume of the current flowing into the charge-up source can be acquired by a filter circuit, which is the equivalent circuit in FIG. 22A. A value that is proportional to the potential of the charge-up source is defined as the beam drift distances Cx and Cy.

In addition, as is described above, the volume of the current flowing into the charge-up source depends on the deflection position of the electron beam. This phenomenon occurs because the orbit of the reflected electrons, etc., is bent by a deflection voltage applied to the deflectors, and the volume of the current flowing to the charge-up source differs depending on the deflection distance, even though the quantity of the reflected electrons is the same. Therefore, this should be corrected. The problem whereof the time constant differs between the electric charging and the discharging can be resolved by changing the time constant for the filter circuit in consonance with the presence of the inflow current.

FIG. 23 is a schematic diagram illustrating a beam drift compensation circuit 227 based on the above idea. A multiplexer 235 selects either reflected electron strength IS or stage current volume Ib, and transmits it to a current compensation circuit 300. The current compensation circuit 300 receives deflection distances Dx and Dy for deflectors, and compensates for a current volume corresponding to the deflection distances Dx and Dy. The corrected current Ix and Iy are fed to a filter circuit 243.

The filter circuit 243 is a model of the equivalent circuit in FIG. 22A, and output V(t) relative to input $I_0(t)$ is acquired in accordance with the characteristic of an equivalent circuit. The filter circuit 243 can be provided as either a hardware component or a software component. The obtained output V(t) is used as beam drift distances Cx and Cy.

Figure 24:
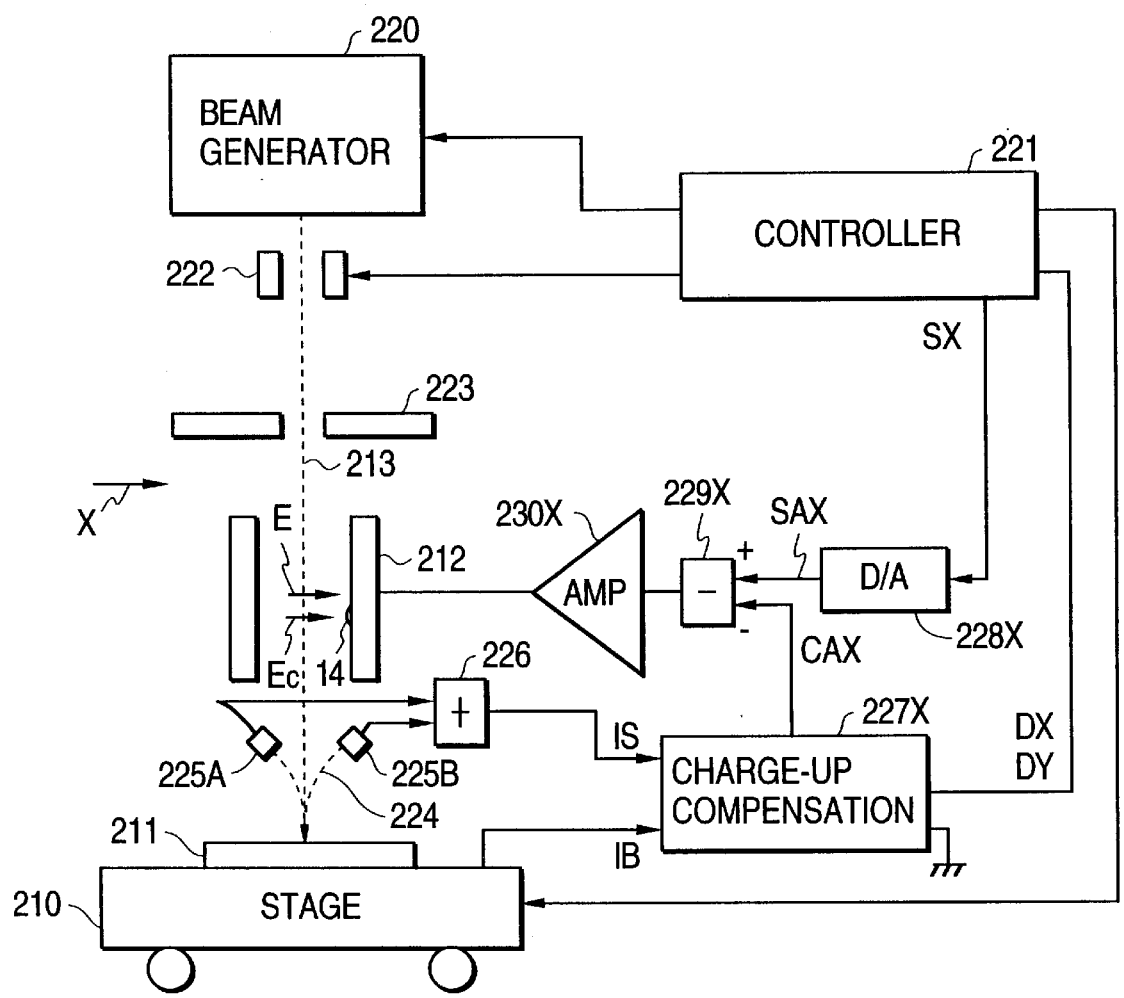
FIG. 24 is a schematic block diagram illustrating the arrangement of a charged particle beam exposure apparatus according to a fifth embodiment of the present invention.

FIG. 24 is a schematic diagram illustrating the arrangement of a charged particle beam exposure apparatus according to a fifth embodiment of the present invention obtained based on the above observations.

A charged particle beam projection apparatus 220 is controlled by a controller 221, and the shape of the cross section of a charged particle beam 213 is similar to a transparent hole pattern in a mask in the charged particle beam projection apparatus 220. The charged particle beam 213 passes through blanking deflectors 222, an opening in an aperture 223 and electrostatic deflectors 212, and is irradiated onto the semiconductor wafer 211. For simplification, an electrostatic lens and electromagnetic deflectors, which are main deflectors, are not shown in FIG. 24.

Secondary electrons 224, which are discharged from a point on the semiconductor wafer 211 irradiated by the charged particle beam 213, are detected by secondary electron detectors 225A and 225B, and sum IS of both detection outputs is obtained by an adder 226 and is transmitted to a charge-up compensation circuit 227X. In actuality, the secondary electron detectors are also located in the Y direction (the vertical direction along the paper face), and these outputs are also summed by the adder 226. The charged particle beam 213, incident to the semiconductor wafer 211, passes through a moving conductive stage 210 and the charge-up compensation circuit 227X, and flows to the ground line, and the current IB is used by the charge-up compensation circuit 227X. Target value DX for an X directional displacement distance and target value DY for a Y directional displacement distance, which are relative to the electrostatic deflectors 212 and the electromagnetic deflectors, are supplied by the controller 221 to the charge-up compensation circuit 227X.

The charge-up compensation circuit 227X acquires X correction value, CAX, by employing one, or both of the secondary electron detection value IS and the current IB, and the target values DX and DY, and transmits the value CAX to the subtrahend input terminal of a subtractor 229X. The subtractor 229X acquires a difference between target value SAX for the X directional sub-deflection distance and X correction value CAX. This difference is amplified by an amplifier 230X and the result is transmitted to the electrostatic deflectors 212. The target value SAX for the X directional sub-deflection distance is obtained by a D/A converter 228 that performs an analog conversion of the target value SX for the X directional sub-deflection distance.

The charge-up compensation circuit 227X, the D/A converter 228X, the subtractor 229X and the amplifier 230X are related to the X directional deflection function of the electrostatic deflectors 212. Although not shown, the same structure is provided for the Y directional deflection function of the electrostatic deflectors 212. The secondary electron detection value IS, the current IB, and the X directional deflection distance target value DX, and the Y directional deflection distance target value DY are also employed for this structure.

Figure 25:
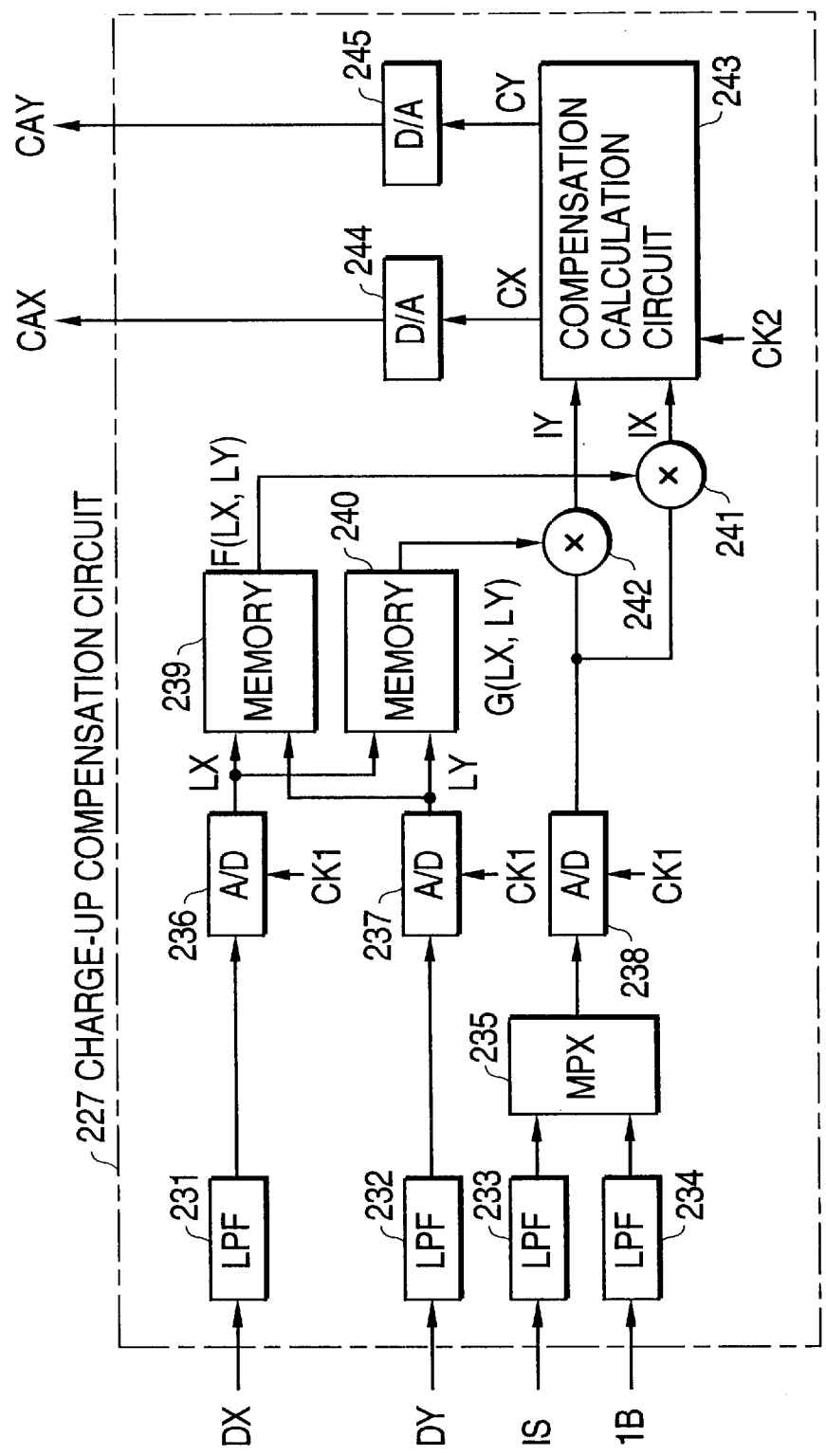
FIG. 25 is a block diagram illustrating an example arrangement for a charge-up correction circuit.

FIG. 25 is a diagram illustrating an example arrangement of the charge-up compensation circuit 227X relative to the X direction and the Y direction. As previously described, since the time constants for the charging and discharging relative to contamination 214 are comparatively large, the X directional deflection distance target value DX, the Y directional deflection distance target value DY, the secondary electron detection value IS and the current IB are respectively passed through low-pass filters 231, 232, 233 and 234, and time-averaging is performed with them to improve the accuracy of compensation. Although both of the secondary electron detection value IS and the current IB may be employed, for simplification, only one of them is selected by the multiplexer 235. This selection is performed by an operator based on the compensation accuracy obtained in the past by each charged particle beam exposure apparatus. In order to perform digital compensation calculation, the outputs of the low-pass filters 231 and 232 and of the multiplexer 235 are transmitted to the A/D converters 236, 237 and 238, and are converted into digital values, which serve as X directional deflection distance target value LX, Y directional deflection distance target value LY and current IC. The digitizing is performed in synchronization with clock CK1.

Both of the target values LX and LY are transmitted to the address input terminals of memories 239 and 240, and function values F(LX, LY) and G(LX, LY) are read from the memories 239 and 240. The product of the current IC and the function value F is obtained as X current volume IX by a multiplier 241, while the product of the current IC and the function value G is obtained as Y current volume IY by a multiplier 242. These current volumes IX and IY are transmitted to a compensation calculator 243. The memories 239 and 240 and the multipliers 241 and 242 correspond to the current compensation circuit 300 in FIG. 23. The function values F and G stored in the memories 239 and 240 are implemented by, for example, a table that is prepared using actual measurement values. The compensation calculator 243 employs the X current volume IX and the Y current volume IY to calculate the X correction value CX and the Y correction value CY for each pulse of the clock CK2. The X correction value CX and the Y correction value CY are respectively converted into analog values by D/A converters 244 and 245, and the analog values are output as the X correction value CAX and the Y correction value CAY.

FIG. 26 is a graph for explaining the principle of the compensation circuit 243. This graph is the same as that for the actual measurement values shown in FIG. 21. Supposing that the drift distances at times t and t+dt are $CX_i$ and $CX_{i+1}$, as is shown in FIG. 26, this exponential function is represented below:

$$e^{-dt/\tau}\{A \cdot IX(t) - CX_i\} = A \cdot IX(t) - CX_{i+1},$$

yielding $$CX_{i+1} = A \cdot IX(t) - \{A \cdot IX(t) - CX_i\}e^{idt/\tau}.$$

Since $CX_0 = 0$ when $t=0$, $Cx_i$ to $CX_{i+1}$ can be acquired for each time dt by using the above expression. $A \cdot IX(t)$, which is the saturation level, is the function for time, and A is the function for IX. These functions can be implemented by a table prepared using actual measurement values. The time constant τ is larger during the discharging. Since whether or not the discharging is performed can be ascertained by referring to the value IX(t), the time constant τ need only be the function of IX(t).

In accordance with the above expression, the compensation calculator 243 can be constituted either by a hardware circuit. Or the drift distance may be acquired by software each time as needed. As changes in the drift distance are comparatively small, even when the software is used to obtain the drift distance it does not affect the exposure speed.

As is described above, since the compensation circuit is provided that calculates the drift distance due to the charge-up by using the electric circuit model, the drift distance, which conventionally is difficult to measure during the exposure process, can be obtained as needed based on the reflected electron strength or the stage current. Therefore, even when the intensity of a beam is increased during the direct exposure of a wafer, the drift distance due to this increase can be appropriately compensated for.

What is claimed is:

1. A charged particle beam exposure method, wherein a charged particle beam having an exposure pattern shape is deflected to irradiate a desired location on a sample based on an exposure data, comprising the steps of:

acquiring a thermal expansion of said sample associated with irradiation by said charged particle beam based on a quantity of said charged particles beamed to said sample;

acquiring a shift from said desired position as a correction distance based on said thermal expansion; and deflecting said charged particle beam in accordance with a deflection amount including said correction distance so as to irradiate said sample with the deflected beam.

2. A charged particle beam exposure method according to claim 1, further comprising the step of acquiring the quantity of said charged particles based on a beam density from a charged particle generator and a density of said exposure pattern.

3. A charged particle beam exposure method according to claim 1, further comprising the step of acquiring said quantity of said charged particles based on a current flowing from said holder holding said sample during the irradiation of said charged particle beam.

4. A charged particle beam exposure method according to claim 1, further comprising the step of acquiring said quantity of said charged particles based on a quantity of electrons reflected from said sample during said irradiation of said charged particle beam.

5. A charged particle beam exposure method according to claim 1, wherein, at said step of acquiring said thermal expansion, said thermal expansion is acquired based on a thermal capacity of said sample, a thermal capacity of said holder holding said sample, thermal conductivity between said sample and said holder, and thermal energy based on said quantity of said charged particles.

6. A charged particle beam exposure method, wherein a charged particle beam having an exposure pattern shape is deflected and irradiates at a desired position on a sample based on an exposure data, comprising the steps of:

acquiring a thermal expansion of said sample associated with irradiation by said charged particle beam based on a quantity of said charged particles beamed to said sample;

acquiring a shifting distance and a rotational distance for said sample resulting from said thermal expansion;

acquiring a distance shifted away from said desired position to serve as a correction distance based on said thermal expansion, said shifting distance and said rotational distance; and deflecting said charged particle beam in accordance with a deflection value including said correction distance to irradiate said sample with the deflected beam.

7. A charged particle beam exposure method according to claim 6, wherein, at said step of acquiring said shifting distance and said rotational distance caused by said thermal expansion, a shifting distance and a rotational distance for said sample that occur in accordance with each thermal expansion are measured in advance, and the measured distance are employed to calculate said shifting distance and said rotational distance for said sample.

8. A charged particle beam exposure method according to claim 6, wherein, at said step of acquiring said shifting distance and said rotational distance caused by said thermal expansion, a location of a mark formed on said sample is detected to acquire said shifting distance and said rotational distance.

9. A charged particle beam exposure apparatus, in which a charged particle beam having an exposure pattern shape is deflected to irradiate at a desired location on a sample based on an exposure data, comprising:

means for acquiring a thermal expansion of said sample associated with the irradiation by said charged particle beam based on a quantity of said charged particles beamed to said sample;

means for acquiring a shift from said desired position as a correction distance based on said thermal expansion; and means for deflecting said charged particle beam to said desired position in accordance with a deflection amount including said correction distance.

10. A charged particle beam exposure apparatus, in which a charged particle beam having an exposure pattern shape is deflected to irradiate at a desired position on a sample based on an exposure data, comprising:

means for acquiring a thermal expansion of said sample associated with irradiation by said charged particle beam based on a quantity of said charged particles beamed to said sample;

means for acquiring a shifting distance and a rotational distance for said sample resulting from said thermal expansion;

means for to acquiring a distance shifted away from said desired position to serve as a correction distance based on a said thermal expansion, said shifting distance and a rotational distance; and means for deflecting said charged particle beam to said desired position in accordance with a deflection value including said correction distance.

11. A charged particle beam exposure method, in which an exposure is performed by irradiating a charged particle beam to a wafer on which a plurality of chip areas are arranged, a width of each of the plurality of chip areas being covered by a plurality of frames having widths corresponding to a required deflection range, the wafer being continuously moved along the frames over the chip areas, the wafer being divided into a plurality of exposure unit areas, each of which includes more than one of the plurality of chip areas such that during irradiation of the each exposure unit area, the wafer is continuously moved for irradiation of the chip areas therein, comprising the steps of:

(a) detecting an alignment mark located in each exposure unit area to acquire a shifting distance for a deflected position of said charged particle beam;

(b) performing exposure processing within each of said exposure unit areas by correcting said deflection position of said charged particle beam in accordance with said shifting distance; and repeating said steps (a) and (b) for each of said exposure unit areas.

12. A charged particle beam exposure method according to claim 11, wherein the number of said chip areas in said exposure unit area is less than a predetermined value wherein a displacement of exposure position in said exposure unit area due to the thermal expansion during an exposure procedure is within a permissible range.

13. A charged particle beam exposure method according to claim 12, wherein said exposure unit area comprises an area of a chip string as a unit.

14. A charged particle beam exposure method according to claim 12, wherein said exposure unit area comprises an area by equally dividing a chip string.

15. A charged particle beam exposure method, in which a charged particle beam is deflected and irradiated to a desired surface location on a sample so as to perform an exposure process for a desired pattern, comprising the steps of:

acquiring a drift distance for changing a location to which said charged particle beam is deflected based on a physical value corresponding to a quantity of said charged particles beamed to the sample; and performing exposure process by correcting a deflection distance for said charged particle beam in accordance with said drift distance.

16. A charged particle beam exposure method according to claim 15, wherein, at said acquiring step, in an electric circuit wherein a capacitor and a resistor are connected in parallel to be supplied with current thereto, a function representing a relationship between said current and a voltage value of said capacitor is employed to acquire said drift distance, by corresponding said physical value to said current and by corresponding said drift distance to said voltage value.

17. A charged particle beam exposure method according to claim 15, wherein said physical value is a quantity of reflected electrons of said charged particle beam or a value of a current from a stage on which a sample is mounted.

18. A charged particle beam exposure method according to claim 17, wherein said physical value is a value obtained by compensating for either the quantity of reflected electrons of said charged particle beam, or the value of the current from the stage on which a sample is mounted, in consonance with a beam deflection distance.

19. An apparatus for irradiating a charged particle beam to a plurality of chip areas arranged on a wafer, comprising:

means for dividing the wafer into exposure unit areas that include more than one of the plurality of chip areas;

means for moving the wafer along a plurality of frames that cover the plurality of chip areas, each of the plurality of frames having widths within a required deflection range; and means for acquiring a shifting distance for a deflected position of the charged particle beam and correcting the deflected position, for each of the exposure unit areas, in accordance with the shifting distance.

* * * * *